(12) United States Patent
Kim et al.

(10) Patent No.: US 10,504,992 B2
(45) Date of Patent: Dec. 10, 2019

(54) SEMICONDUCTOR DEVICE AND METHOD FOR FABRICATING THE SAME

(71) Applicant: Samsung Electronics Co., Ltd., Suwon-si (KR)

(72) Inventors: Seok Hoon Kim, Suwon-si (KR); Hyun Jung Lee, Suwon-si (KR); Kyung Hee Kim, Pyeongtaek-si (KR); Sun Jung Kim, Suwon-si (KR); Jin Bum Kim, Seoul (KR); Il Gyou Shin, Hwaseong-si (KR); Seung Hun Lee, Hwaseong-si (KR); Cho Eun Lee, Pocheon-si (KR); Dong Suk Shin, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 19 days.

(21) Appl. No.: 15/715,832

(22) Filed: Sep. 26, 2017

(65) Prior Publication Data

US 2018/0138269 A1 May 17, 2018

(30) Foreign Application Priority Data

Nov. 16, 2016 (KR) ........................ 10-2016-0152414

(51) Int. Cl.
| | |
|---|---|
| *H01L 29/66* | (2006.01) |
| *H01L 29/08* | (2006.01) |
| *H01L 21/02* | (2006.01) |
| *H01L 29/161* | (2006.01) |
| *H01L 29/78* | (2006.01) |

(Continued)

(52) U.S. Cl.
CPC ...... *H01L 29/0847* (2013.01); *H01L 21/0257* (2013.01); *H01L 21/02532* (2013.01); *H01L 29/161* (2013.01); *H01L 29/165* (2013.01); *H01L 29/66636* (2013.01); *H01L 29/66795* (2013.01); *H01L 29/785* (2013.01); *H01L 29/7848* (2013.01); *H01L 29/7851* (2013.01);
(Continued)

(58) Field of Classification Search
CPC ......... H01L 29/66636; H01L 29/66795; H01L 29/7848; H01L 29/785
See application file for complete search history.

(56) References Cited

U.S. PATENT DOCUMENTS

| | | |
|---|---|---|
| 7,608,515 B2 | 10/2009 | Chen et al. |
| 8,404,546 B2 | 3/2013 | Woon et al. |

(Continued)

*Primary Examiner* — Mark V Prenty
(74) *Attorney, Agent, or Firm* — Muir Patent Law, PLLC

(57) ABSTRACT

There is provided a semiconductor device capable of enhancing short channel effect by forming a carbon-containing semiconductor pattern in a source/drain region. The semiconductor device includes a first gate electrode and a second gate electrode spaced apart from each other on a fin-type pattern, a recess formed in the fin-type pattern between the first gate electrode and the second gate electrode, and a semiconductor pattern including a lower semiconductor film formed along a profile of the recess and an upper semiconductor film on the lower semiconductor film, wherein the lower semiconductor film includes a lower epitaxial layer and an upper epitaxial layer sequentially formed on the fin-type pattern, and a carbon concentration of the upper epitaxial layer is greater than a carbon concentration of the lower epitaxial layer.

16 Claims, 33 Drawing Sheets

(51) Int. Cl.
*H01L 29/165* (2006.01)
*H01L 29/167* (2006.01)

(52) U.S. Cl.
CPC ...... *H01L 29/167* (2013.01); *H01L 29/66545* (2013.01)

(56) References Cited

U.S. PATENT DOCUMENTS

| | | |
|---|---|---|
| 8,471,307 B2 | 6/2013 | Khamankar et al. |
| 9,287,398 B2 | 3/2016 | Kwok et al. |
| 9,337,337 B2 | 5/2016 | Kwok et al. |
| 9,337,339 B1 | 5/2016 | Lee et al. |
| 9,368,628 B2 | 6/2016 | Li et al. |
| 2009/0108291 A1 | 4/2009 | Cheng et al. |
| 2010/0230721 A1 | 9/2010 | Yasutake |
| 2015/0372143 A1 | 12/2015 | Bae et al. |
| 2016/0293762 A1* | 10/2016 | Li .................. H01L 29/7848 |

* cited by examiner

US 10,504,992 B2

SEMICONDUCTOR DEVICE AND METHOD FOR FABRICATING THE SAME

CROSS-REFERENCE TO RELATED APPLICATION

This application claims priority from Korean Patent Application No. 10-2016-0152414 filed on Nov. 16, 2016 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device and a method for fabricating the same.

2. Description of the Related Art

For semiconductor device density enhancement, the multigate transistor has been suggested as one of the scaling technologies, according to which a silicon body in a fin-like shape is formed on a substrate, with gates then being formed on the surface of the silicon body.

Such multi-gate transistor may allow easy scaling, as it uses a three-dimensional channel. Further, current control capability may be enhanced without requiring increased gate length of the multi-gate transistor. Furthermore, it may be possible to effectively suppress short channel effect (SCE) which is a phenomenon that the electric potential of the channel region is influenced by a drain voltage.

SUMMARY

A technical object of the present disclosure is to provide a semiconductor device capable of enhancing short channel effect by forming a carbon-containing semiconductor pattern in a source/drain region.

Another technical object of the present disclosure is to provide a method for fabricating a semiconductor device capable of enhancing short channel effect by forming a carbon-containing epitaxial layer in a source/drain region.

The objects according to the present disclosure are not limited to those set forth above and objects other than those set forth above will be clearly understood to a person skilled in the art from the following description.

According to an aspect of the of the present disclosure, there is provided a semiconductor device comprising a first gate electrode and a second gate electrode spaced apart from each other on a fin-type pattern of a PMOS forming region; a recess formed in the fin-type pattern between the first gate electrode and the second gate electrode; and a semiconductor pattern including a lower semiconductor film formed along a profile of the recess and an upper semiconductor film on the lower semiconductor film, the lower semiconductor film and the upper semiconductor film including silicon germanium, respectively, wherein the lower semiconductor film includes a lower epitaxial layer and an upper epitaxial layer sequentially formed on the fin-type pattern, and a carbon concentration of the upper epitaxial layer is greater than a carbon concentration of the lower epitaxial layer.

According to another aspect of the of the present disclosure, there is provided a semiconductor device a fin-type pattern; a first gate electrode and a second gate electrode spaced apart from each other on the fin-type pattern, and crossing over the fin-type pattern; a recess formed in the fin-type pattern between the first gate electrode and the second gate electrode; and a semiconductor pattern formed along a profile of the recess and including a lower semiconductor film containing carbon and an upper semiconductor film on the lower semiconductor film, the first semiconductor pattern is doped with a p-type impurity; wherein a carbon concentration of the lower semiconductor film increases as a distance from the fin-type pattern increases in a direction.

According to still another aspect of the of the present disclosure, there is provided a semiconductor device comprising a fin-type pattern of a PMOS forming region; a first gate electrode and a second gate electrode spaced apart from each other on the fin-type pattern, and crossing over the fin-type pattern; a first gate spacer on a sidewall of the first gate electrode; a recess formed in the fin-type pattern between the first gate electrode and the second gate electrode; and a semiconductor pattern formed along a profile of the recess and including a lower semiconductor film containing carbon and an upper semiconductor film on the lower semiconductor film, wherein the semiconductor pattern includes a dopant segregation region having a dopant concentration greater than dopant concentrations of regions of the semiconductor pattern close to the dopant segregation region.

According to still another aspect of the of the present disclosure, there is provided a semiconductor device comprising a first fin-type pattern of a PMOS forming region; a second fin-type pattern of an NMOS forming region; a first gate electrode and a second gate electrode spaced apart from each other on the first fin-type pattern, the first gate electrode and the second gate electrode crossing over the first fin-type pattern; a third gate electrode and a fourth gate electrode spaced apart from each other on the second fin-type pattern, third gate electrode and a fourth gate electrode crossing over the second fin-type pattern; a first recess formed in the first fin-type pattern between the first gate electrode and the second gate electrode; a second recess formed in the second fin-type pattern between the third gate electrode and the fourth gate electrode; a first semiconductor pattern formed along a profile of the first recess and comprising a lower semiconductor film containing carbon and an upper semiconductor film on the lower semiconductor film, wherein a carbon concentration the lower semiconductor film increases as a distance from the first fin-type pattern increases in a direction; and a second semiconductor pattern formed in the second recess.

According to still another aspect of the of the present disclosure, there is provided a method for fabricating a semiconductor device comprising forming a fin-type pattern of a PMOS forming region on a substrate; forming a first gate electrode and a second gate electrode on the fin-type pattern, the first gate electrode and the second gate electrode crossing over the fin-type pattern and being spaced apart from each other; forming a recess in the fin-type pattern between the first gate electrode and the second gate electrode; forming a first lower silicon germanium film along a profile of the recess; forming a first upper silicon germanium film on the first lower silicon germanium film, the first upper silicon germanium film extending along the first lower silicon germanium film and containing carbon; and forming a second silicon germanium film on the first upper silicon germanium film, the second silicon germanium film having a germanium fraction greater than a germanium fraction of the first upper silicon germanium film.

According to still another aspect of the of the present disclosure, there is provided a semiconductor device comprising a fin-type pattern of a PMOS forming region on a substrate; a first gate electrode and a second gate electrode spaced apart from each other on the fin-type pattern, the first gate electrode and the second gate electrode crossing over the fin-type pattern; a recess in the fin-type pattern between the first gate electrode and the second gate electrode; a first lower semiconductor film along a profile of the recess, wherein the first lower semiconductor film includes a first lower epitaxial layer having a first carbon concentration and a first upper epitaxial layer having a second carbon concentration different from the first carbon concentration; and a first upper semiconductor film on the first lower semiconductor film, the first upper semiconductor film extending along the first lower semiconductor film, and having a third carbon concentration, wherein the second carbon concentration of the first upper epitaxial layer is greater than the third carbon concentration of the first upper semiconductor film.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

Figure 1:
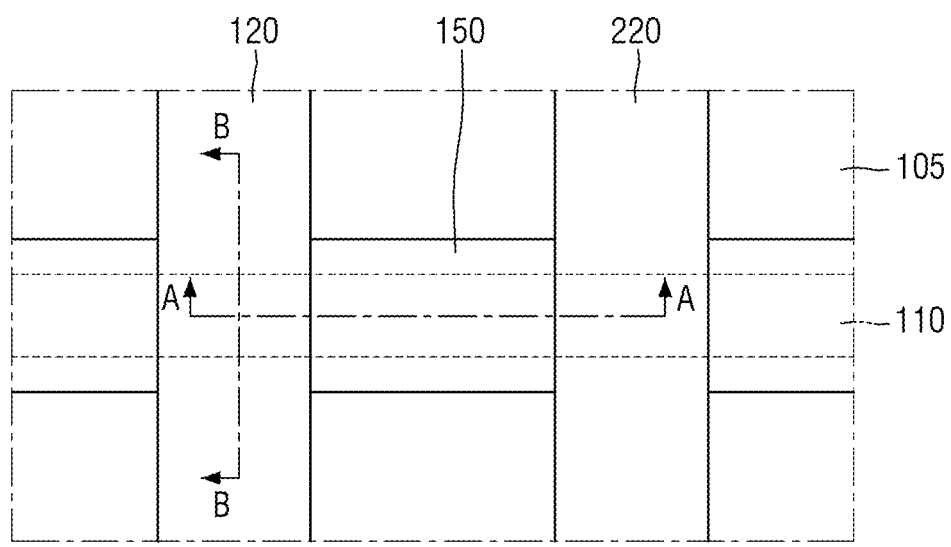
FIG. 1 is a top plan view provided to explain a semiconductor device according to some example embodiments of the present disclosure.
Figure 1:
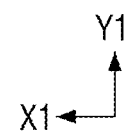

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also, these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Although drawings regarding a semiconductor device according to some example embodiments exemplify a fin-type transistor (FinFET) including a channel region in a fin-type pattern shape, example embodiments are not limited thereto. It is of course possible that the semiconductor device according to some example embodiments may include a tunneling transistor (tunneling FET), a transistor including nanowire, a transistor including nano-sheet, or a three-dimensional (3D) transistor. Further, the semiconductor device according to some example embodiments may include a bipolar junction transistor, a laterally diffused metal oxide semiconductor (LDMOS) transistor, and so on.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Figure 2:
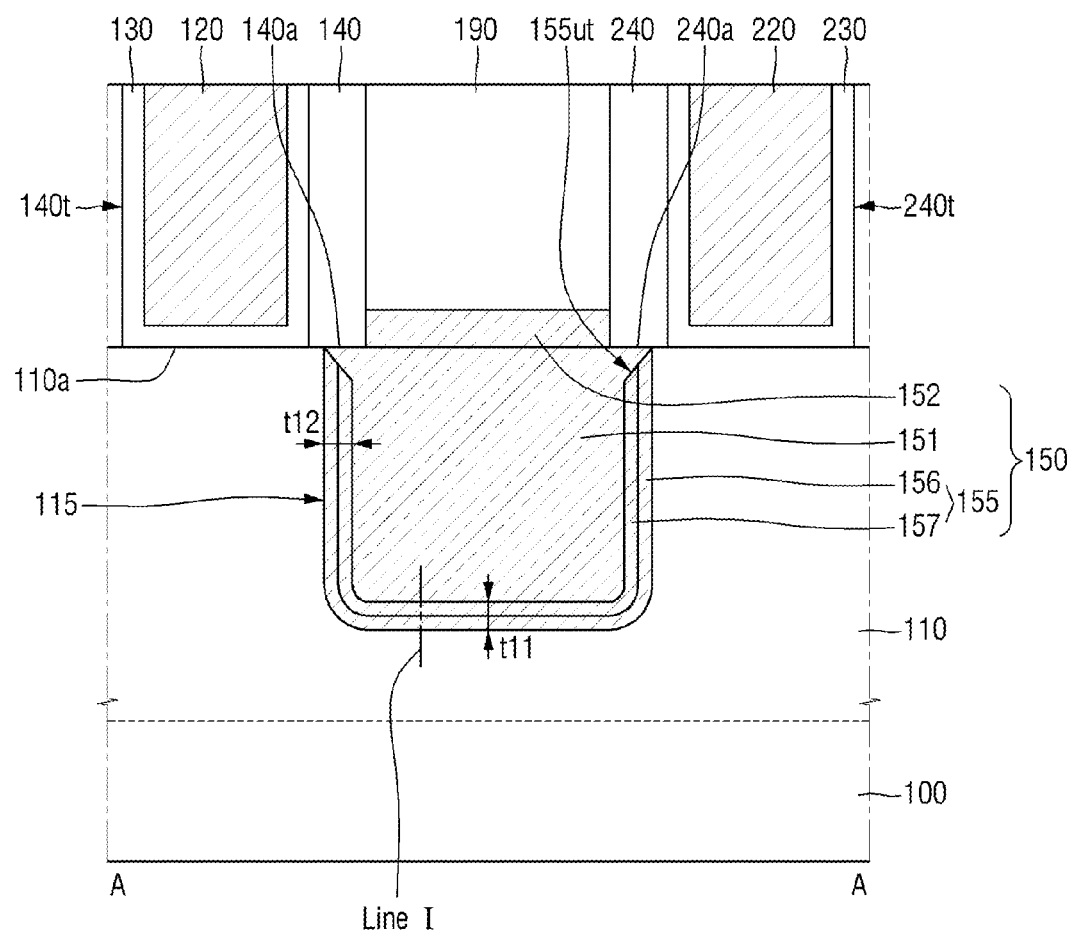
FIG. 2 is a cross-sectional view taken on line A-A of FIG. 1.
Figure 3:
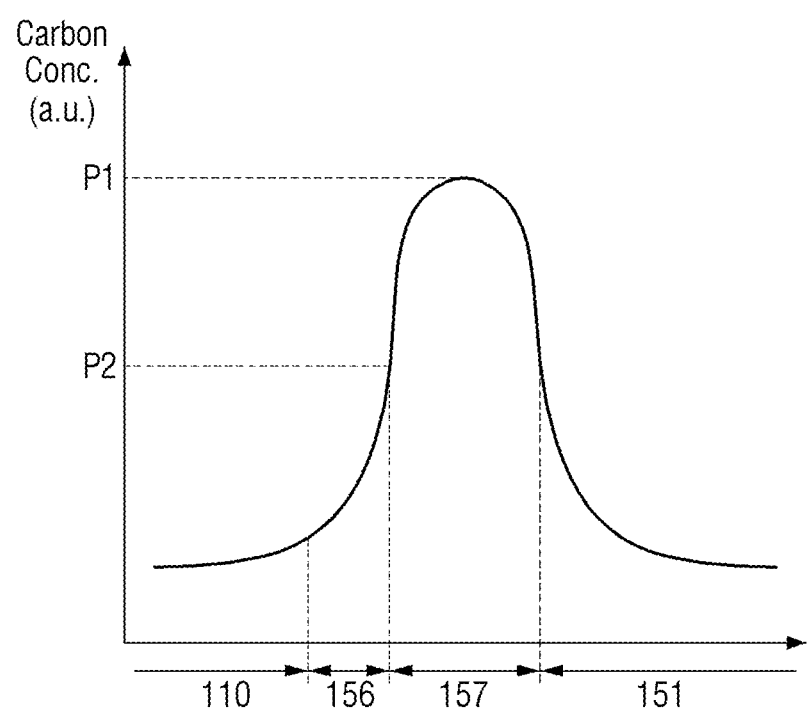
FIG. 3 is a schematic view illustrating a concentration of carbon along Line I of FIG. 2.
Figure 4A:
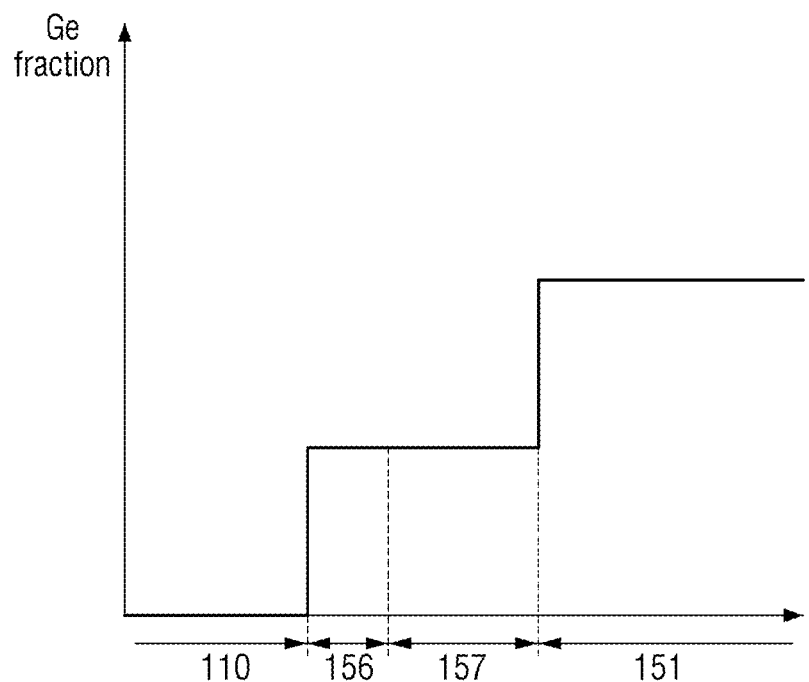
FIGS. 4A and 4B are schematic views illustrating germanium fraction of a first lower semiconductor film and a first upper semiconductor film.
Figure 4B:
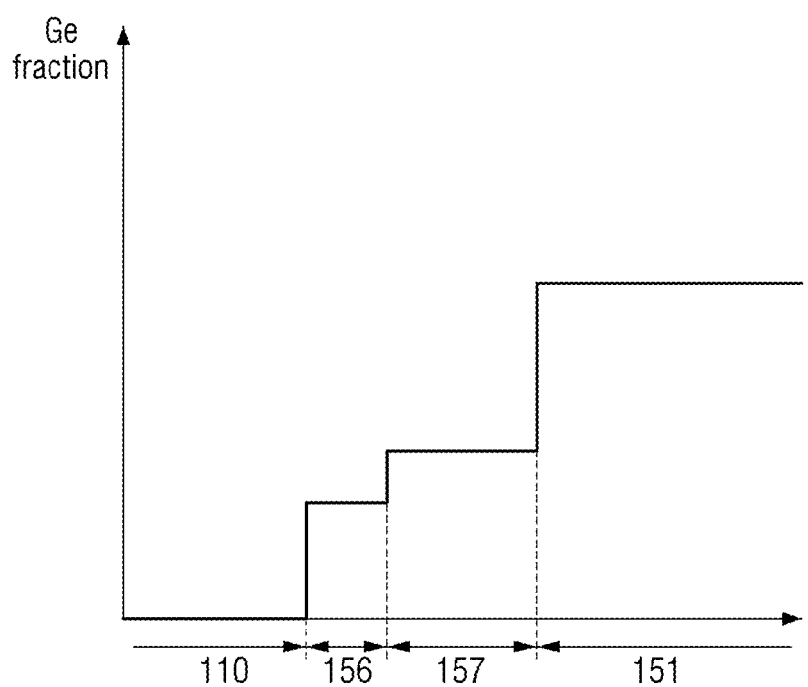
Figure 5:
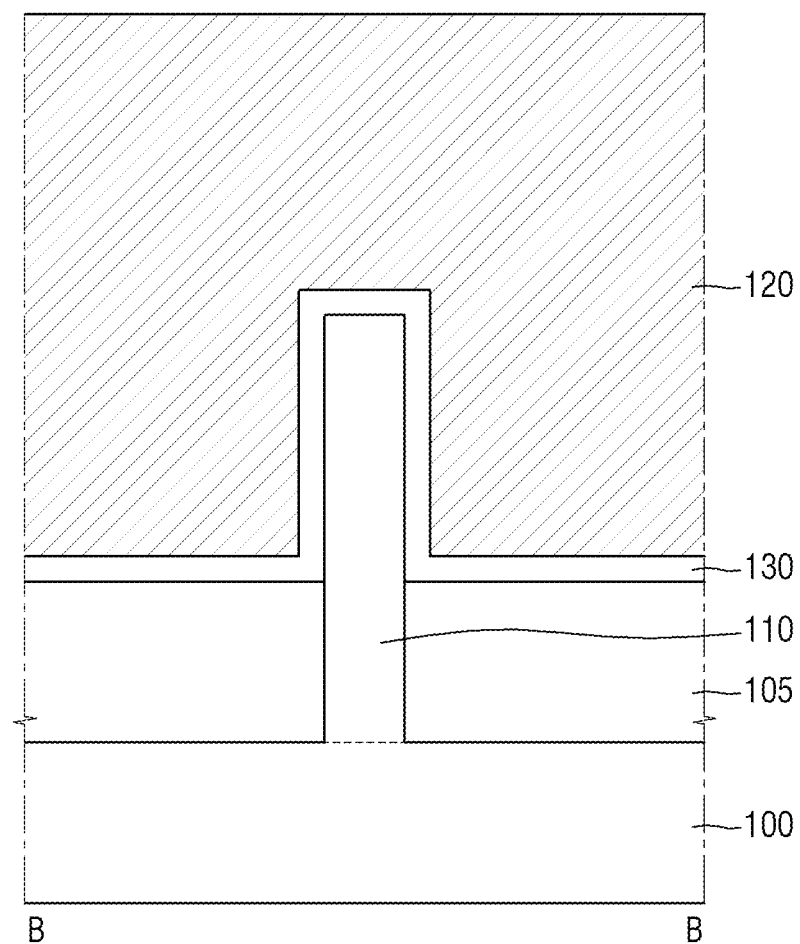
FIG. 5 is a cross-sectional view taken on line B-B of FIG. 1.

FIG. 1 is a top plan view provided to explain a semiconductor device according to some example embodiments of the present disclosure. FIG. 2 is a cross sectional view taken on line A-A of FIG. 1. FIG. 3 is a schematic view illustrating a concentration of carbon along Line I of FIG. 2. FIGS. 4A and 4B are schematic views illustrating germanium fraction of a first lower semiconductor film and a first upper semiconductor film. FIG. 5 is a cross sectional view taken on line B-B of FIG. 1. For convenience of explanation, in FIG. 1, a first fin-type pattern 110, a first gate electrode 120, a second gate electrode 220, and a first semiconductor pattern 150 are illustrated.

Referring to FIGS. 1 to 5, the semiconductor device according to some example embodiments may include the first fin-type pattern 110, the first gate electrode 120, the second gate electrode 220, a first gate spacer 140, a second gate spacer 240, a first recess 115, and the first semiconductor pattern 150.

A substrate 100 may be a bulk silicon or a silicon-on-insulator (SOI). Alternatively, the substrate 100 may be a silicon substrate, or may include other material such as silicon germanium, silicon germanium on insulator (SGOI), indium antimonide, lead telluride, indium arsenide, indium phosphide, gallium arsenide, or gallium antimonide, but example embodiments are not limited thereto.

The first fin-type pattern 110 may protrude from the substrate 100. The first fin-type pattern 110 may extend longitudinally on the substrate 100 and in a first direction X1. For example, the first fin-type pattern 110 may include a long side extending in the first direction X1, and a short side extending in a second direction Y1.

The first fin-type pattern 110 may be a part of the substrate 100, and may include an epitaxial layer grown from the substrate 100. The first fin-type pattern 110 may include an element semiconductor material such as silicon or germanium, for example. Further, the first fin-type pattern 110 may include a compound semiconductor such as, for example, IV-IV group compound semiconductor or III-V group compound semiconductor.

In some embodiments, the first fin-type pattern 110 may include IV-IV group compound semiconductor. For example, the first fin-type pattern 110 may be a binary compound or a ternary compound including, for example, at least two or more of carbon (C), silicon (Si), germanium (Ge), and tin (Sn), or the such binary or ternary compound doped with IV group element.

In some embodiments, the first fin-type pattern 110 may include III-V group compound semiconductor. For example, the first fin-type pattern 110 may be one of a binary compound, a ternary compound or a quaternary compound which is formed by a combination of a III group element which may be at least one of aluminum (Al), gallium (Ga), or indium (In), with a V group element which may be one of phosphorus (P), arsenic (As) or antimony (Sb).

The first fin-type pattern 110 of the semiconductor device according to some example embodiments is a silicon fin-type pattern that includes silicon.

A field insulating film 105 may be formed on the substrate 100. The field insulating film 105 may partially overlie the first fin-type pattern 110. For example, the field insulating film 105 may partially overlie a sidewall of the first fin-type pattern 110.

An upper surface of the first fin-type pattern 110 may protrude upward higher than an upper surface of the field insulating film 105 formed adjacent to the long side of the first fin-type pattern 110. For example, the uppermost surface of the first fin-type pattern 110 in a direction perpendicular (e.g., vertical direction) to the substrate 100 may be disposed at a level higher than the uppermost surface of the field insulating film 105 in the direction perpendicular to the substrate 100. The first fin-type pattern 110 may be defined by the field insulating film 105 on the substrate 100.

For example, the field insulating film 105 may include at least one of silicon oxide film, silicon nitride film, or silicon oxynitride film.

Further, the field insulating film 105 may additionally include at least one field liner film (not shown) formed between the first fin-type pattern 110 and the field insulating film 105. When the field insulating film 105 further includes the field liner film, the field liner film may include at least one of polysilicon, amorphous silicon, silicon oxynitride, silicon nitride, or silicon oxide.

The first gate electrode 120 may be formed, extending in the second direction Y1 and crossing over the first fin-type pattern 110. The first gate electrode 120 may be formed on the first fin-type pattern 110 and the field insulating film 105.

The second gate electrode 220 may be formed, extending in the second direction Y1 and crossing over the first fin-type pattern 110. The second gate electrode 220 may be formed on the first fin-type pattern 110 and the field insulating film 105.

The second gate electrode 220 may be formed in parallel with the first gate electrode 120. The first gate electrode 120 and the second gate electrode 220 may be spaced apart from each other, and arranged in the first direction X1.

The first gate electrode 120 and the second gate electrode 220 may respectively include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof. The first gate electrode 120 and the second gate electrode 220 may each include conductive metal oxide, conductive metal oxynitride, and oxidized form of the materials described above.

For example, the first gate electrode 120 and the second gate electrode 220 may be formed by the replacement process (or gate last process), but example embodiments are not limited thereto.

The first gate spacer 140 may be formed on a sidewall of the first gate electrode 120. The first gate spacer 140 may define a first trench 140t.

The second gate spacer 240 may be formed on a sidewall of the second gate electrode 220. The second gate spacer 240 may define a second trench 240t.

The first gate spacer 140 and the second gate spacer 240 may each include at least one of, for example, silicon nitride (SiN), silicon oxynitride (SiON), silicon oxide (SiO$_2$), silicon oxycarbonitride (SiOCN), and a combination thereof.

The first gate spacer 140 and the second gate spacer 240 are each shown as a single film, but example embodiments are not limited thereto, and these may have a multi-film structure.

A first gate insulating film 130 may be formed between the first fin-type pattern 110 and the first gate electrode 120. The first gate insulating film 130 may be formed along a profile of the first fin-type pattern 110 protruding upward further than the field insulating film 105. For example, the uppermost surface of the first gate insulating film 130 in a direction perpendicular to the substrate 100 may be disposed at a level higher than the uppermost surface of the field insulating film 105 in the direction perpendicular to the substrate 100.

The first gate insulating film 130 may be formed along the opposite sidewalls and the bottom surface of the first trench 140t. The first gate insulating film 130 may be formed between the first gate spacer 140 and the first gate electrode 120.

A second gate insulating film 230 may be formed between the first fin-type pattern 110 and the second gate electrode 220. The second gate insulating film 230 may be formed along a profile of the first fin-type pattern 110 protruding upward further than the field insulating film 105.

The second gate insulating film 230 may be formed along the opposite sidewalls and the bottom surface of the second trench 240t. The second gate insulating film 230 may be formed between the second gate spacer 240 and the second gate electrode 220.

Unlike the illustration in FIG. 2, an interfacial layer may be additionally formed between the first gate insulating film 130 and the first fin-type pattern 110, and between the second gate insulating film 230 and the first fin-type pattern 110.

When the first fin-type pattern 110 is silicon fin-type pattern, the interfacial layer may include a silicon oxide, for example. For example, the interfacial layer may vary depending on a material included in the first fin-type pattern 110.

The first gate insulating film 130 and the second gate insulating film 230 may include a high-k dielectric material having a higher dielectric constant than a silicon oxide film. For example, the first gate insulating film 130 and the second gate insulating film 230 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The first recess 115 may be formed between the first gate electrode 120 and the second gate electrode 220. More specifically, the first recess 115 may be formed between the first gate spacer 140 and the second gate spacer 240 which are facing each other. The first recess 115 is formed within the first fin-type pattern 110.

In FIG. 2, a sidewall of the first recess 115 adjacent to the first gate spacer 140 and a sidewall of the first gate spacer 140, and a sidewall of the first recess 115 adjacent to the second gate spacer 240 and a sidewall of the second gate spacer 240 are not aligned in a line.

For example, at an interface between an upper surface 110a of the first fin-type pattern and bottom surfaces 140a and 240a of the first and second gate spacers, a width between the first gate spacer 140 and the second gate spacer 240 adjacent to and facing each other in a direction parallel (e.g., horizontal direction) to an upper surface of the substrate 100 may be less than a width between the sidewalls of the first recess 115 in the direction parallel to the upper surface of the substrate 100.

Alternatively, at least a portion of the bottom surface 140a of the first gate spacer and/or at least a portion of the bottom surface 240a of the second gate spacer may be exposed by the first recess 115.

The first semiconductor pattern 150 may be formed within the first recess 115. The first semiconductor pattern 150 may be formed on the first fin-type pattern 110, between the first gate electrode 120 and the second gate electrode 220. The first semiconductor pattern 150 may be a semiconductor epitaxial pattern grown by using epitaxial process.

The first semiconductor pattern 150 may be included within the source/drain of a transistor which uses the first fin-type pattern 110 as a channel region. In a semiconductor device according to some example embodiments, the first semiconductor pattern 150 may be included in the source/drain of a PMOS transistor.

The first semiconductor pattern 150 may include a doped p-type dopant. For example, the first semiconductor pattern 150 may include at least one of B, In, Ga, and Al. In a semiconductor device according to some example embodiments, the first semiconductor pattern 150 is described as comprising a boron (B) as a p-type dopant.

The first semiconductor pattern 150 may include a first lower semiconductor film 155, a first upper semiconductor film 151, and a first capping semiconductor film 152, which are sequentially formed on the first fin-type pattern 110.

The first lower semiconductor film 155 may be formed along a profile of the first recess 115. The first lower semiconductor film 155 may extend along the sidewall and the bottom surface of the first recess 115.

The first lower semiconductor film 155 may include an inclined upper surface 155ut near both an interface between the bottom surface 140a of the first gate spacer 140 and the upper surface 110a of the first fin-type pattern 110 and an interface between the bottom surface 240a of the second gate spacer 240 and the upper surface 110a of the first fin-type pattern 110. The upper surface 155ut of the first lower semiconductor film 155 may have an obtuse angle with respect to the upper surface 110a of the first fin-type pattern 110. For example, the upper surface 155ut of the first lower semiconductor film may have an acute angle with respect to the bottom surface 140a of the first gate spacer 140 vertically overlapping the first semiconductor pattern 150.

In the semiconductor device according to some example embodiments, a thickness t11 of the first lower semiconductor film 155 on the bottom surface of the first recess 115 in a direction perpendicular to the supper surface of the substrate 100 may be substantially the same as a thickness t12 of the first lower semiconductor film 155 on the sidewall of the first recess 115 in a direction parallel to the surface of the substrate 100. In this example, the thickness t12 of the first lower semiconductor film 155 on the sidewall of the first recess 115 may be a thickness measured at a certain portion except the upper surface 155ut of the first lower semiconductor film that is inclined.

The first lower semiconductor film 155 may include silicon germanium, for example. Further, to suppress diffusion of the p-type dopant doped in the source/drain into the channel region, the first lower semiconductor film 155 may include, for example, carbon (C). The first lower semiconductor film 155 may include, for example, about 0.01% to about 5% carbon by weight.

The first upper semiconductor film 151 may be formed on the first lower semiconductor film 155. The first upper semiconductor film 151 may fill the first recess 115 in which the first lower semiconductor film 155 is formed.

The first upper semiconductor film 151 may overlie the inclined upper surface 155ut of the first lower semiconductor film. For example, the first upper semiconductor film 151 may fill between the upper surface 155ut of the first lower semiconductor film 155 and the bottom surface 140a of the first gate spacer 140, and between the upper surface 155ut of the first lower semiconductor film 155 and the bottom surface 240a of the second gate spacer 240.

In the semiconductor device according to some example embodiments, the first upper semiconductor film 151 may be in contact with the first lower semiconductor film 155. The expression "contact" as used herein may mean that there is no film interposed between the first upper semiconductor film 151 and the first lower semiconductor film 155.

The first upper semiconductor film 151 may include silicon germanium, for example.

In FIG. 2, the upper surface of the first upper semiconductor film 151 is shown as lying on the same plane as the upper surface 110a of the first fin-type pattern, but example embodiments are not limited thereto.

The first capping semiconductor film 152 may be formed on the first upper semiconductor film 151. The first capping semiconductor film 152 may include silicon, for example. Although not shown in FIG. 2, a metal silicide film may be further formed on at least a portion of the first capping semiconductor film 152.

In FIGS. 2 and 3, the carbon concentration of the first lower semiconductor film 155 may include an interval that increases as the distance from the first fin-type pattern 110 increases. For example, along a direction from the interface between the first fin-type pattern 110 and the first semiconductor pattern 150 to inside of the first semiconductor pattern 150, the first lower semiconductor film 155 may include a portion where carbon concentration gradually increases. For example, the carbon concentration of the first lower semiconductor film 155 at the interface between the first fin-type pattern 110 and the first semiconductor pattern 150 is less than the carbon concentration at the center portion of the first lower semiconductor film 155.

For example, the first lower semiconductor film 155 may include a first lower epitaxial layer 156 and a first upper epitaxial layer 157 sequentially formed on the first fin-type pattern 110. The first lower epitaxial layer 156 may be formed along a profile of the first recess 115. The first upper epitaxial layer 157 may be formed on the first lower epitaxial layer 156.

The carbon concentration of the first upper epitaxial layer 157 is greater than that of the first lower epitaxial layer 156. The average carbon concentration in the first upper epitaxial layer 157 is greater than the average carbon concentration in the first lower epitaxial layer 156.

For example, the maximum value P1 of the carbon concentration in the first upper epitaxial layer 157 is greater than the maximum value P2 of the carbon concentration in the first lower epitaxial layer 156.

For example, the ratio of the maximum value P1 of the carbon concentration in the first upper epitaxial layer 157 to the maximum value P2 of the carbon concentration in the first lower epitaxial layer 156 may be in a range between 10 and 100 inclusive.

Further, the carbon concentration of the first upper epitaxial layer 157 is greater than that of the first upper semiconductor film 151. The average carbon concentration in the first upper epitaxial layer 157 is greater than the average carbon concentration in the first upper semiconductor film 151. The maximum value P1 of the carbon concentration in the first upper epitaxial layer 157 is greater than the maximum value of the carbon concentration in the first upper semiconductor film 151.

During forming of the first lower epitaxial layer 156, a precursor that can supply carbon may not be provided. On the other hand, during forming of the first upper epitaxial layer 157, a precursor for supplying carbon is provided.

When carbon is supplied during forming of the first lower epitaxial layer 156, the carbon will passivate the surface of the first fin-type pattern 110. In such a case, the first semiconductor pattern 150 may not be epitaxially grown continuously in the first recess 115.

Accordingly, there is no artificial supply of precursor for supplying the carbon, and the first lower epitaxial layer 156 in contact with the first fin-type pattern 110 is grown epitaxially. For example, the carbon existing in the equipment for forming the first lower epitaxial layer 156 may be introduced into the first lower epitaxial layer 156.

In order to suppress the diffusion of the p-type dopant included in the first semiconductor pattern 150 into the channel region, a precursor for supplying carbon is provided while the first upper epitaxial layer 157 is formed.

The carbon supplied during the formation of the first upper epitaxial layer 157 may also enter the substitutional site of the silicon germanium lattice location but may also enter the interstitial site rather than the lattice location of the silicon germanium.

In the subsequent semiconductor fabricating process, the carbon entered the interstitial site of the first upper epitaxial layer 157 may be diffused into the adjacent first lower epitaxial layer 156 and first upper semiconductor film 151. Through such diffusion, the first lower epitaxial layer 156 and the first upper semiconductor film 151 may include carbon.

In FIGS. 4A and 4B, the germanium fraction of the first lower semiconductor film 155 may be less than the germanium fraction of the first upper semiconductor film 151. For example, the germanium fraction of the first lower epitaxial layer 156 and the germanium fraction of the first upper epitaxial layer 157 is less than the germanium fraction of the first upper semiconductor film 151.

As one example, the germanium fraction of the first lower semiconductor film 155 may be constant as the distance from the first fin-type pattern 110 increases. For example, as illustrated in FIG. 4A, the germanium fraction of the first lower epitaxial layer 156 may be substantially the same as the germanium fraction of the first upper epitaxial layer 157.

As another example, the germanium fraction of the first lower semiconductor film 155 may increase as the distance from the first fin-type pattern 110 increases. For example, as illustrated in FIG. 4B, the germanium fraction of the first lower epitaxial layer 156 is less than the germanium fraction of the first upper epitaxial layer 157.

As illustrated in FIGS. 4A and 4B, the first fin-type pattern 110 may not include germanium, although example embodiments are not limited thereto. For example, at the interface between the first fin-type pattern 110 and the first semiconductor pattern 150, the first fin-type pattern 110 may include germanium diffused from the first semiconductor pattern 150.

In some example embodiments, an interlayer insulating film 190 may be formed on the first semiconductor pattern 150. The interlayer insulating film 190 may surround the sidewalls of the first gate spacer 140 and the second gate spacer 240. In some example embodiments, the interlayer insulating film 190 may include silicon oxide, silicon nitride, silicon oxynitride, flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

Figure 6:
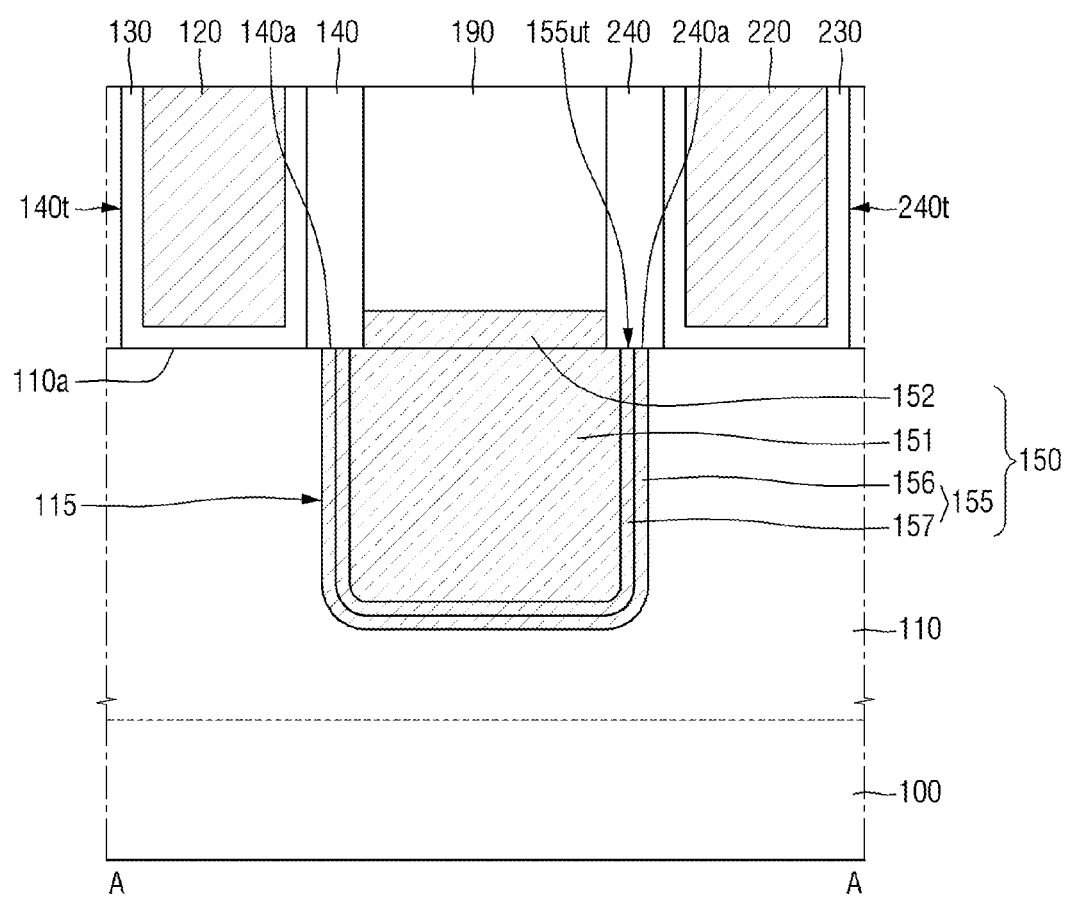
FIG. 6 is a cross-sectional view provided to explain a semiconductor device according to some example embodiments of the present disclosure of the present disclosure.
Figure 7:
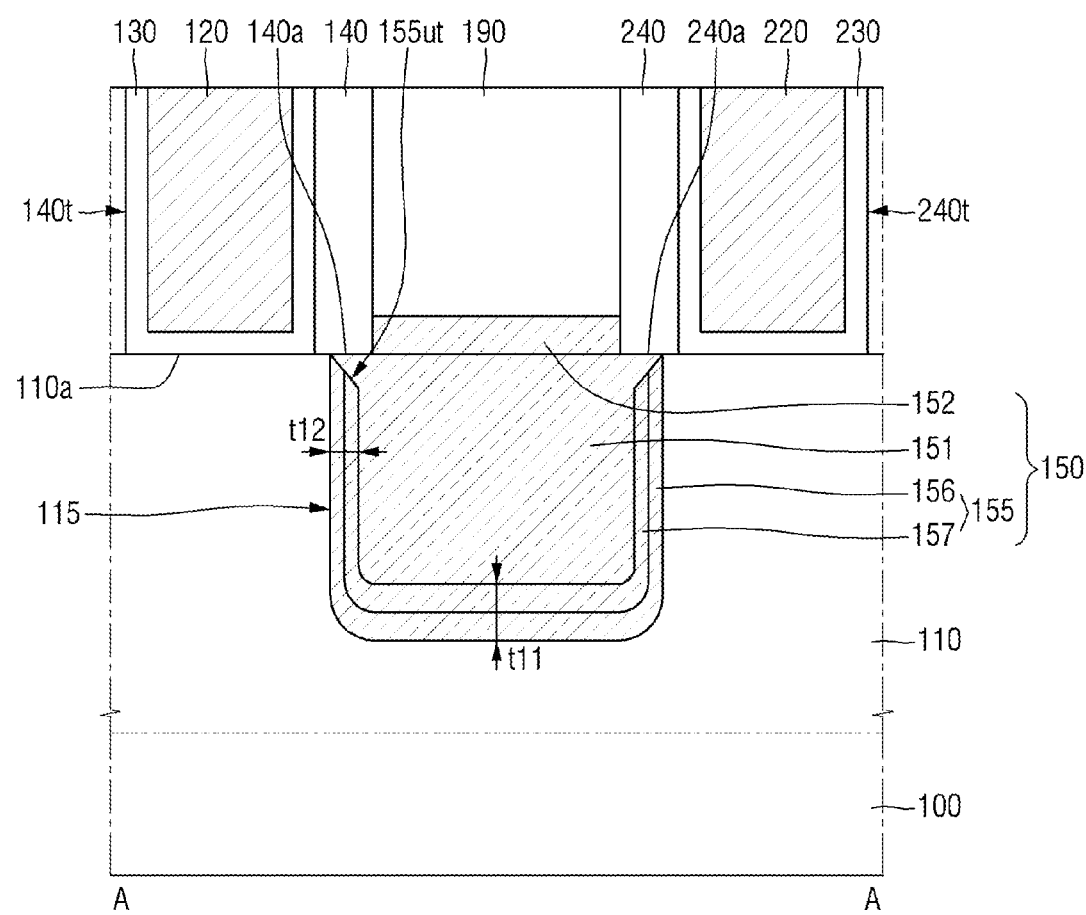
FIG. 7 is a cross-sectional view provided to explain a semiconductor device according to some example embodiments of the present disclosure of the present disclosure.

FIG. 6 is a cross-sectional view provided to explain a semiconductor device according to some example embodiments of the present disclosure. FIG. 7 is a cross-sectional view provided to explain a semiconductor device according to some example embodiments of the present disclosure. For convenience of explanation, differences that are not explained above with reference to FIGS. 1 to 5 will be mainly explained below.

Referring to FIG. 6, in a semiconductor device according to some example embodiments, an upper surface 155*ut* of the first lower semiconductor film may extend along the bottom surface 140*a* of the first gate spacer and the bottom surface 240*a* of the second gate spacer.

The first lower semiconductor film 155 may not include an upper surface having a slope with respect to the upper surface 110*a* of the first fin-type pattern or the bottom surfaces 140*a* and 240*a* of the first and second gate spacers.

In the semiconductor device according to some example embodiments, the first lower semiconductor film 155 may be conformally formed along the profile of the first recess 115. For example, the first lower epitaxial layer 156 may be conformally formed along a profile of the first recess 115. The first upper epitaxial layer 157 may be conformally formed along the profile of the first lower epitaxial layer 156 on the first lower epitaxial layer 156.

Referring to FIG. 7, in the semiconductor device according to some example embodiments, the thickness t11 of the first lower semiconductor film 155 on the bottom surface of the first recess 115 in a direction perpendicular to the upper surface of the substrate 100 may be different from the thickness t12 of the first lower semiconductor film 155 on the sidewall of the first recess 115 in a direction parallel to the upper surface of the substrate 100.

For example, the thickness t11 of the first lower semiconductor film 155 on the bottom surface of the first recess 115 in a direction perpendicular to the upper surface of the substrate 100 may be greater than the thickness t12 of the first lower semiconductor film 155 on the sidewall of the first recess 115 in a direction parallel to the upper surface of the substrate 100.

As an example, the thickness of the first lower epitaxial layer 156 on the bottom surface of the first recess 115 in a direction perpendicular to the upper surface of the substrate 100 may be greater than the thickness of the first lower epitaxial layer 156 on the sidewall of the first recess 115 in a direction parallel to the upper surface of the substrate 100. As other example, the thickness of the first upper epitaxial layer 157 on the bottom surface of the first recess 115 in a direction perpendicular to the upper surface of the substrate 100 may be greater than the thickness of the first upper epitaxial layer 157 on the sidewall of the first recess 115 in a direction parallel to the upper surface of the substrate 100. In some embodiments, the thickness of the first lower epitaxial layer 156 on the bottom surface of the first recess 115 in a direction perpendicular to the upper surface of the substrate 100 may be greater than the thickness of the first lower epitaxial layer 156 on the sidewall of the first recess 115 in a direction parallel to the upper surface of the substrate 100, and the thickness of the first upper epitaxial layer 157 on the bottom surface of the first recess 115 in a direction perpendicular to the upper surface of the substrate 100 may be greater than the thickness of the first upper epitaxial layer 157 on the sidewall of the first recess 115 in a direction parallel to the upper surface of the substrate 100.

Figure 8:
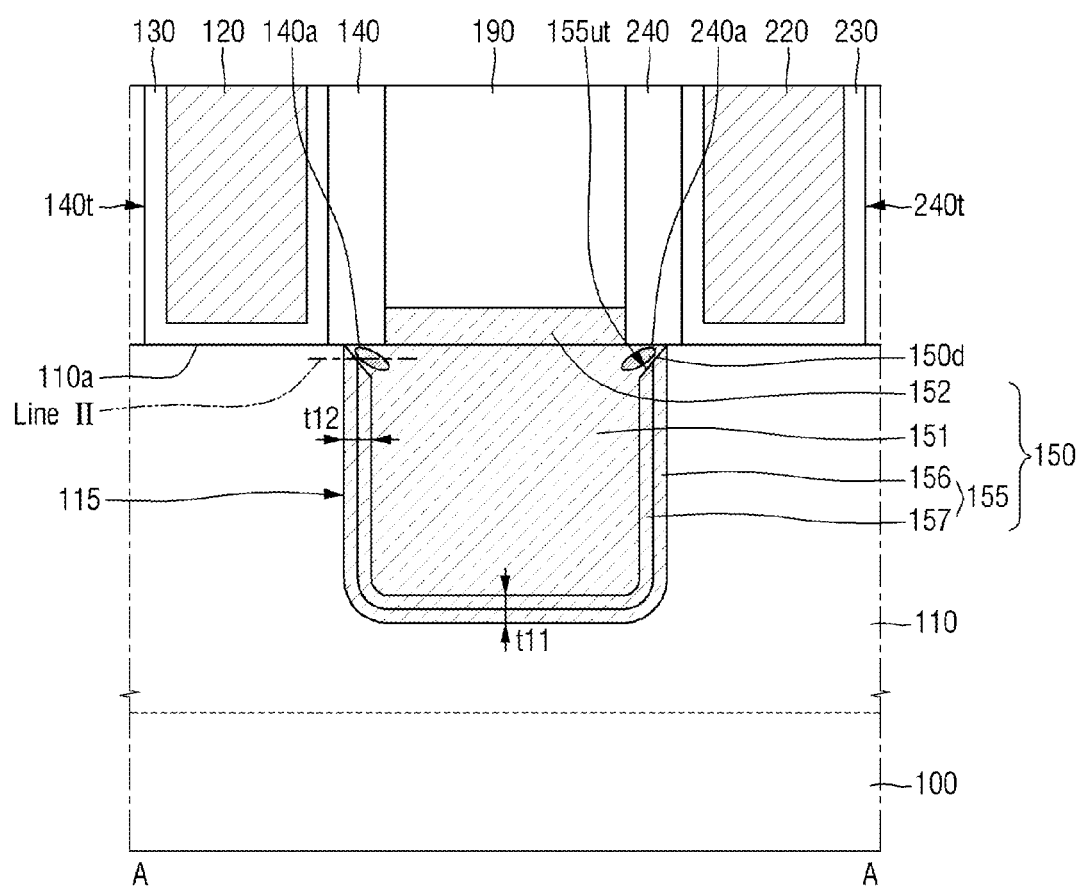
FIG. 8 is a cross-sectional view provided to explain a semiconductor device according to some example embodiments of the present disclosure.
Figure 9:
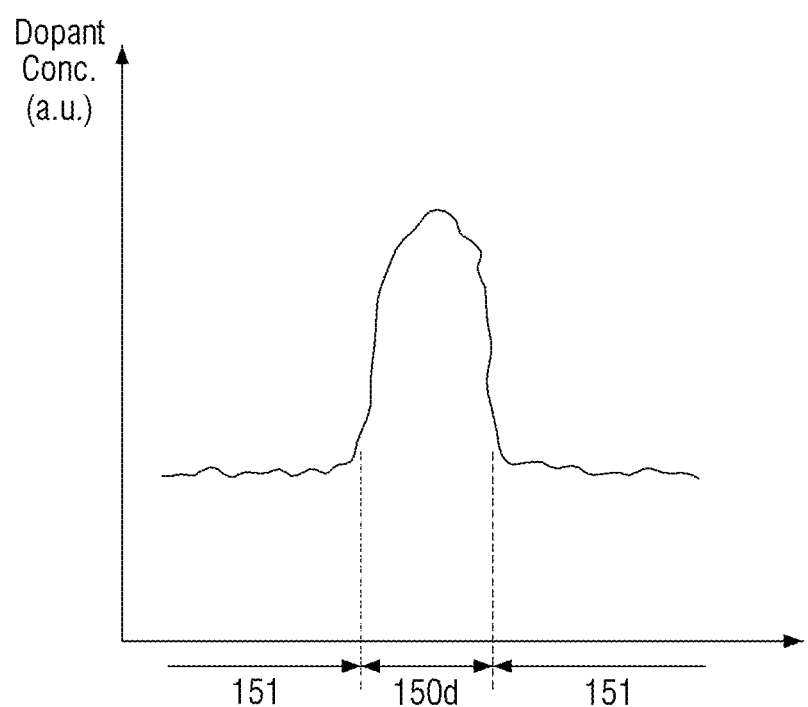
FIG. 9 is a schematic view illustrating a concentration of a p-type dopant along Line II of FIG. 8.

FIG. 8 is a cross-sectional view provided to explain a semiconductor device according to some example embodiments of the present disclosure. FIG. 9 is a schematic view illustrating a concentration of a p-type dopant along Line II of FIG. 8. For convenience of explanation, differences that are not explained above with reference to FIGS. 1 to 5 will be mainly explained below.

Referring to FIGS. 8 and 9, in a semiconductor device according to some example embodiments, the first semiconductor pattern 150 may include a dopant segregation region 150*d*. The dopant segregation region 150*d* may be a region having a dopant concentration higher than the dopant concentrations of nearby areas.

The dopant segregation region 150*d* may be formed by gathering the doped dopant included in the first semiconductor pattern 150 in a predetermined region. As a result, the dopant concentration in the dopant segregation region 150*d* is higher than the dopant concentrations of areas near the dopant segregation region 150*d*.

For example, at least a portion of the dopant segregation region 150*d* may overlap vertically with the first gate spacer 140 and the second gate spacer 240.

The dopant segregation region 150*d* may be located in the first upper semiconductor film 151. For example, at least a portion of the dopant segregation region 150*d* may be located between the upper surface 155*ut* of the first lower semiconductor film 155 and the bottom surface 140*a* of the first gate spacer 140, and between the upper surface 155*ut* of the first lower semiconductor film 155 and the bottom surface 240*a* of the second gate spacer 240.

As illustrated in FIG. 9, the dopant concentration of the dopant segregation region 150*d* is higher than the dopant concentration of the first upper semiconductor film 151 near the dopant segregation region 150*d*.

Figure 10:
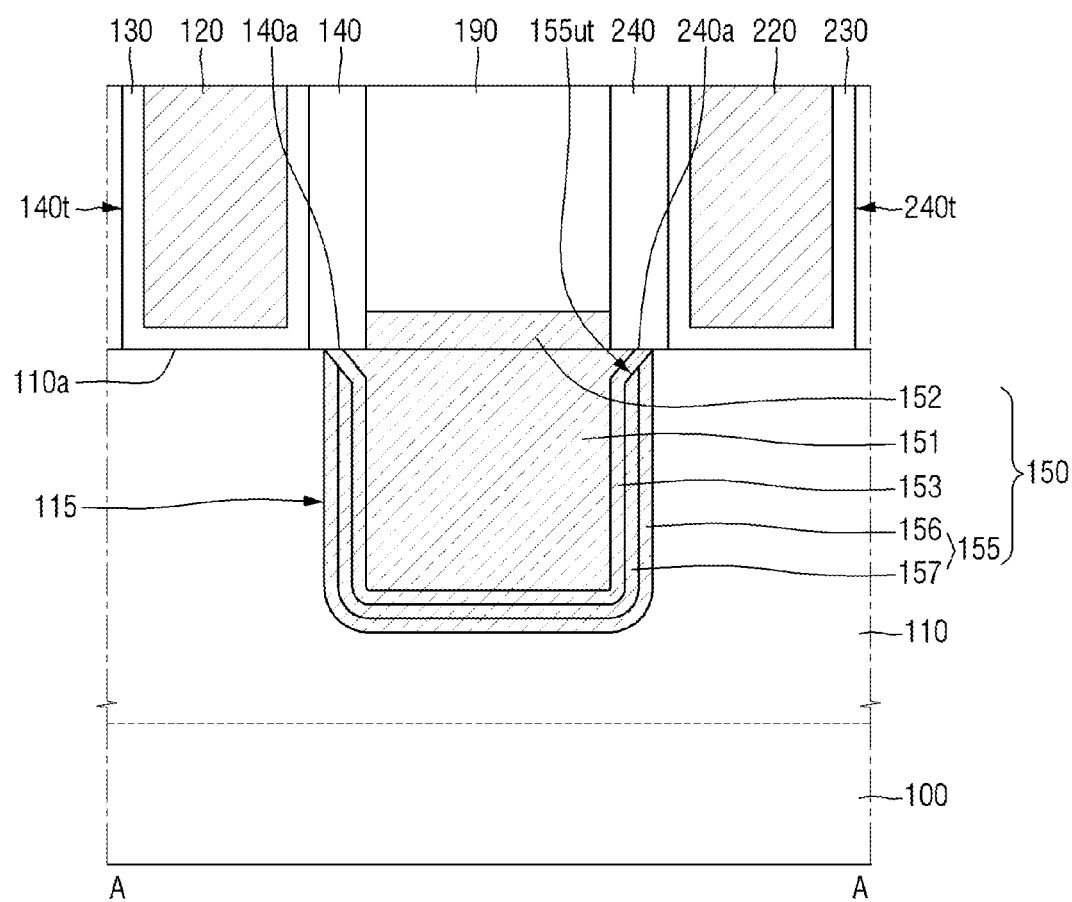
FIG. 10 is a cross-sectional view provided to explain a semiconductor device according to some example embodiments of the present disclosure.
Figure 11:
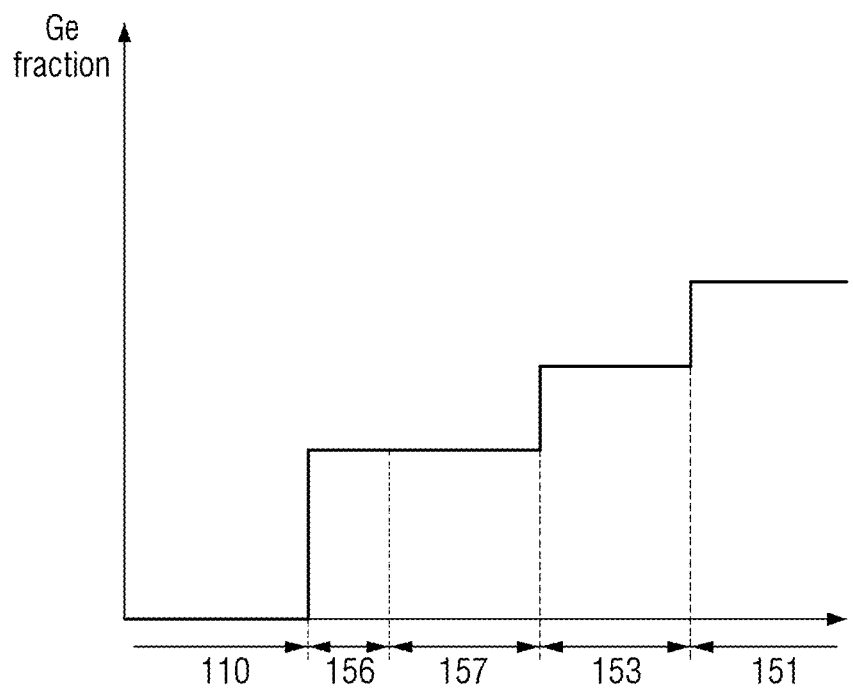
FIGS. 11 and 11A are schematic views illustrating a germanium fraction of a first semiconductor pattern except for a first capping semiconductor film.

FIG. 10 is a cross-sectional view provided to explain a semiconductor device according to some example embodiments of the present disclosure. FIG. 11 is a schematic view illustrating a germanium fraction of a first semiconductor pattern except for a first capping semiconductor film. For convenience of explanation, differences that are not explained above with reference to FIGS. 1 to 5 will be mainly explained below.

Figure 11A:
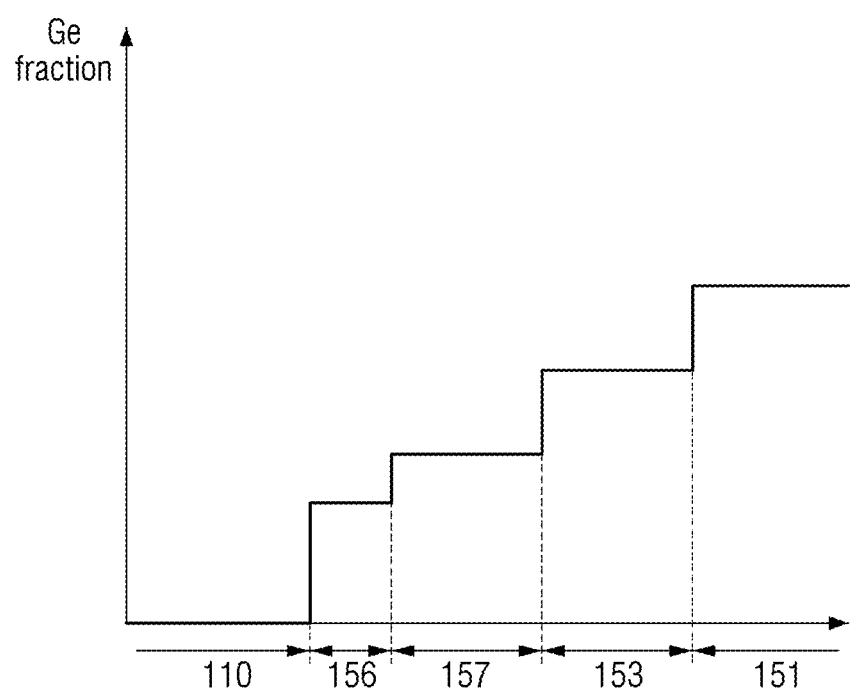

Referring to FIGS. 10, 11, and 11A, in the semiconductor device according to some example embodiments, the first semiconductor pattern 150 may further include a first insertion semiconductor film 153 formed between the first lower semiconductor film 155 and the first upper semiconductor film 151.

The first insertion semiconductor film 153 may be formed along a profile of the first lower semiconductor film 155. As one example, the first insertion semiconductor film 153 may overlie the upper surface 155*ut* of the first lower semiconductor film 155. As another example, unlike the structure shown in FIG. 10, the first insertion semiconductor film 153 may not overlie the upper surface 155*ut* of the first lower semiconductor film.

The first insertion semiconductor film 153 may include silicon germanium, for example.

In FIG. 10, the thickness of the first insertion semiconductor film 153 on the bottom surface of the first recess 115 in a direction perpendicular to the upper surface of the substrate 100 is substantially equal to the thickness of the first insertion semiconductor film 153 on the sidewall of the first recess 115 in a direction parallel to the upper surface of the substrate 100, but example embodiments are not limited thereto.

As illustrated in FIG. 11, the germanium fraction of the first insertion semiconductor film 153 is greater than the germanium fraction of the first lower semiconductor film 155, and less than the germanium fraction of the first upper semiconductor film 151. The germanium fraction of the first lower epitaxial layer 156 is less than the germanium fraction of the first insertion semiconductor film 153 and the germanium fraction of the first upper epitaxial layer 157 is less than the germanium fraction of the first insertion semiconductor film 153. The germanium fraction of the first lower epitaxial layer 156 is equal to the germanium fraction of the first upper epitaxial layer 157.

Unlike the illustration in FIG. 11, the germanium fraction of the first lower epitaxial layer 156 may different than the germanium fraction of the first upper epitaxial layer 157. For example, as illustrated in FIG. 11A, the germanium fraction of the first lower epitaxial layer 156 may be less than the germanium fraction of the first upper epitaxial layer 157.

Figure 12:
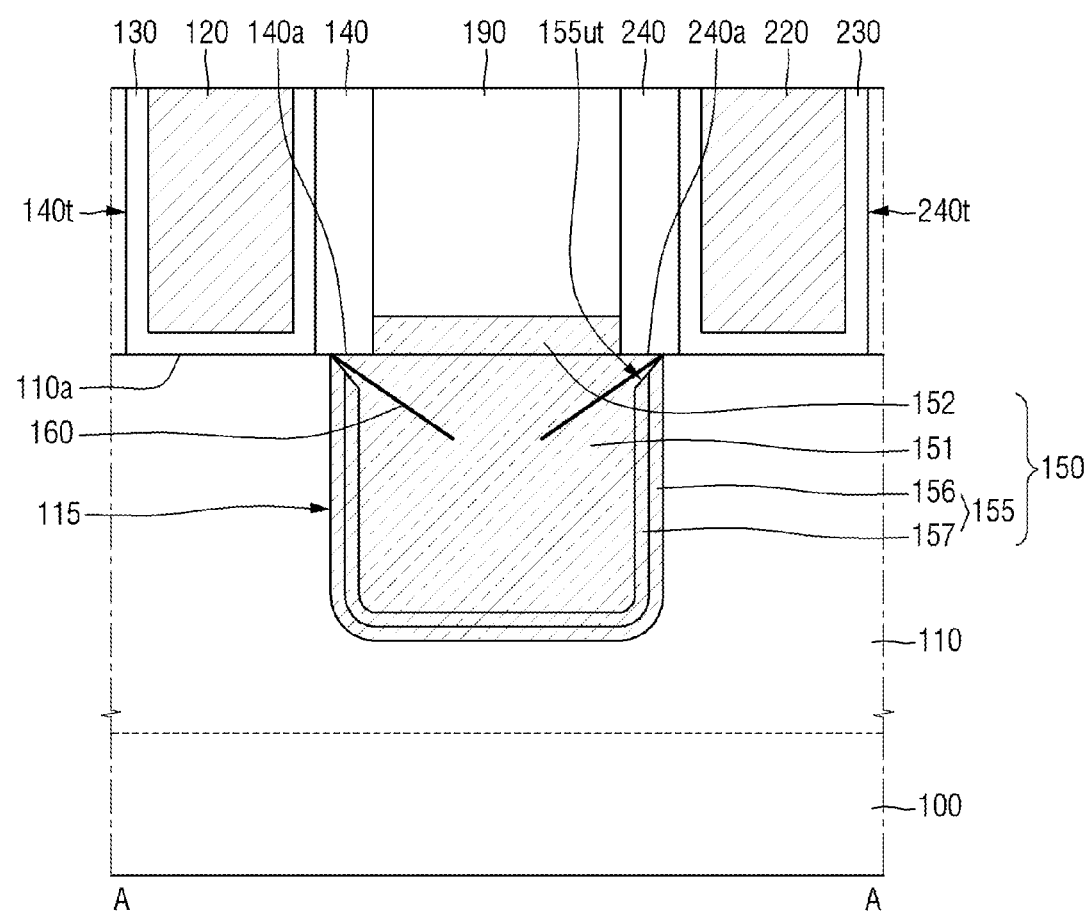
FIG. 12 is a cross-sectional view provided to explain a semiconductor device according to some example embodiments of the present disclosure.

FIG. 12 is a cross-sectional view provided to explain a semiconductor device according to some example embodiments of the present disclosure. For convenience of explanation, differences that are not explained above with reference to FIGS. 1 to 5 will be mainly explained below.

Referring to FIG. 12, in a semiconductor device according to some example embodiments, the first semiconductor pattern 150 may include a surface defect 160.

The surface defect 160 may extend with a slope with respect to the upper surface 110a of the first fin-type pattern 110. The surface defect 160 may extend obliquely toward the bottom surface of the first recess 115, for example, toward the substrate 100.

The surface defect 160 may extend from the bottom surface 140a of the first gate spacer 140 and the bottom surface 240a of the second gate spacer 240 and may be propagated and terminated within the first semiconductor pattern 150.

In a semiconductor device according to example embodiments, the surface defect 160 may be, for example, a stacking fault.

In FIG. 12, although each of the surface defects 160 extending from the bottom surfaces 140a and 240a of the first and second gate spacers 140 and 240, respectively, are shown as not contacting each other, example embodiments are not limited thereto. For example, each of the surface defects 160 may be terminated after contacting each other.

Figure 13:
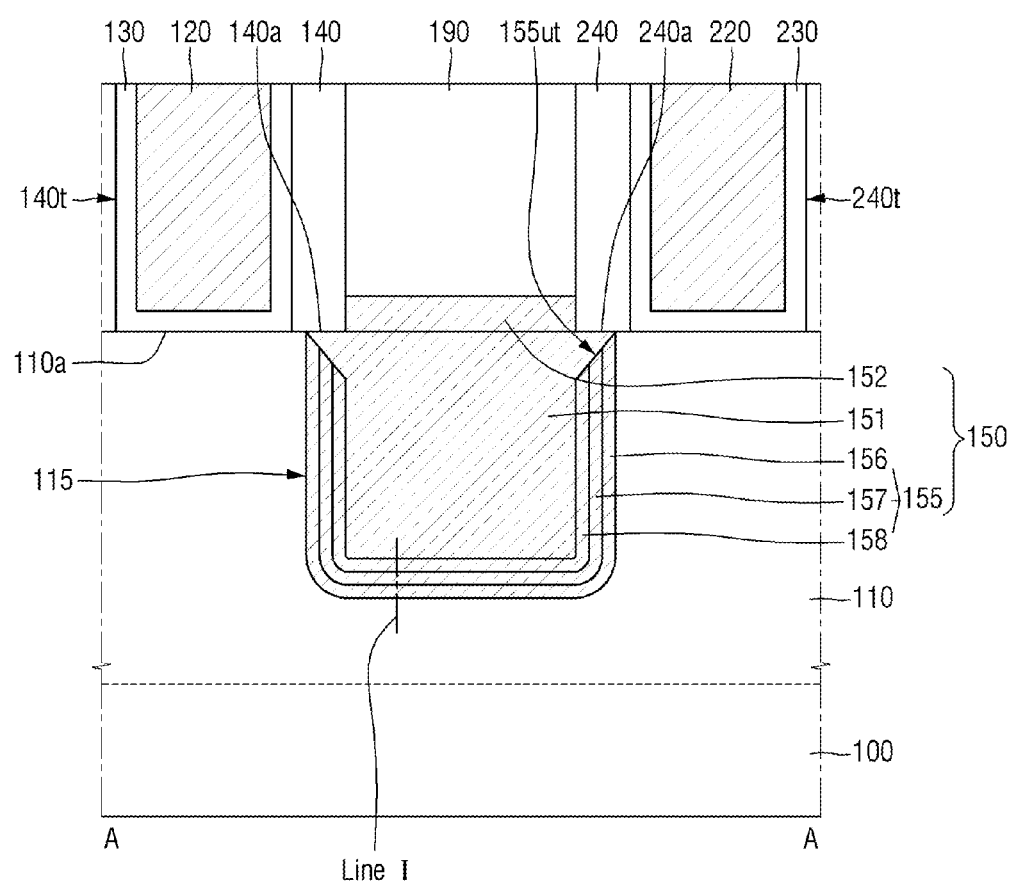
FIG. 13 is a cross-sectional view provided to explain a method for fabricating a semiconductor device according to some example embodiments of the present disclosure.
Figure 14:
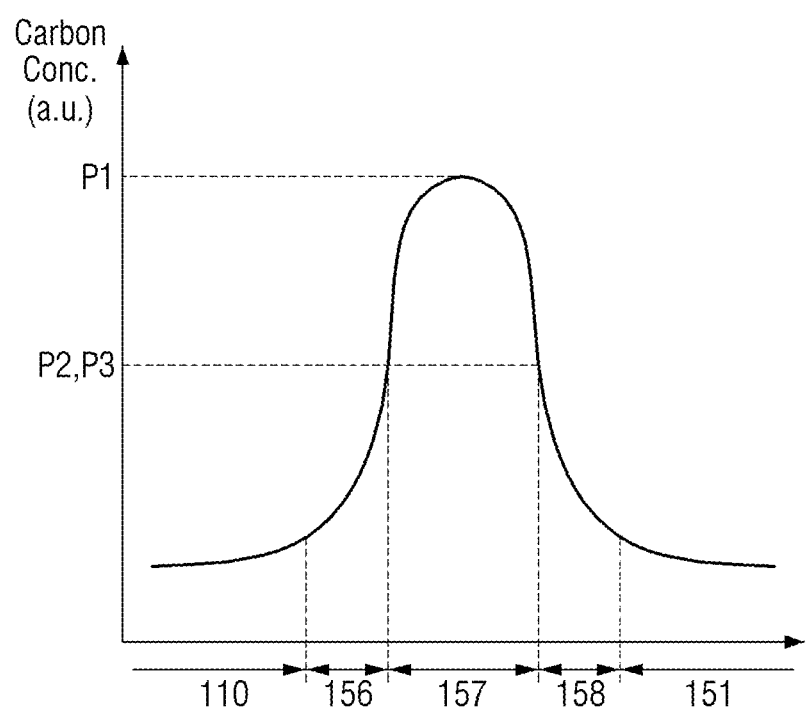
FIG. 14 is a schematic view illustrating a concentration of carbon along Line I of FIG. 13.
Figure 15:
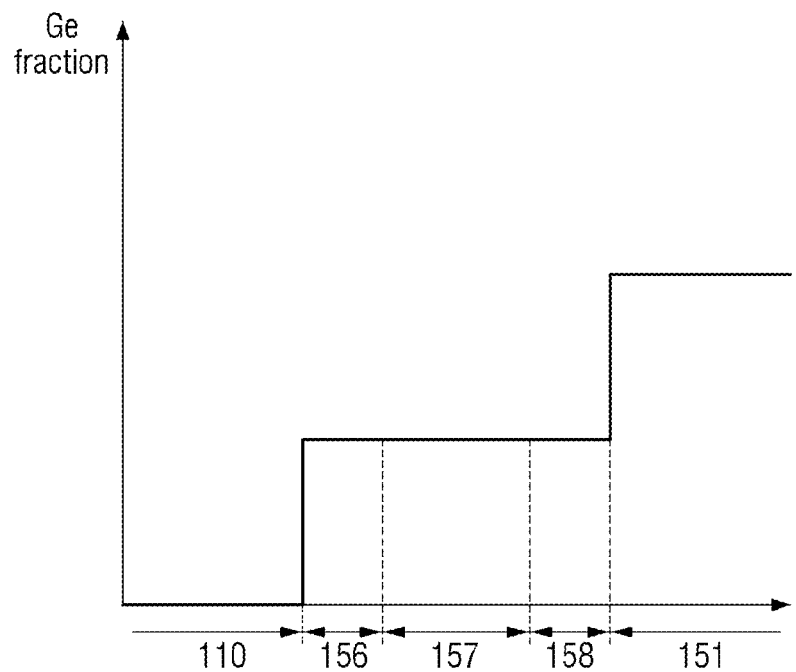
FIGS. 15 and 15A are schematic views illustrating germanium fraction of a first lower semiconductor film and a first upper semiconductor film.

FIG. 13 is a cross-sectional view provided to explain a method of fabricating a semiconductor device according to some example embodiments of the present disclosure. FIG. 14 is a schematic view illustrating a concentration of carbon along Line I of FIG. 13. FIG. 15 is a schematic view illustrating germanium fraction of a first lower semiconductor film and a first upper semiconductor film. For convenience of explanation, differences that are not explained above with reference to FIGS. 1 to 5 will be mainly explained below.

Referring to FIGS. 13 to 15A, in a semiconductor device according to some example embodiments, the first lower semiconductor film 155 may include a first capping epitaxial layer 158.

The first capping epitaxial layer 158 may be formed between the first upper epitaxial layer 157 and the first upper semiconductor film 151. The first capping epitaxial layer 158 may be in contact with the first upper epitaxial layer 157.

In FIG. 13, an upper surface 155ut of the first lower semiconductor film is defined by the first lower epitaxial layer 156, the first upper epitaxial layer 157, and the first capping epitaxial layer 158, but example embodiments are not limited thereto.

Unlike the illustration, the first capping epitaxial layer 158 may include a portion extending along an inclined upper surface of the first lower epitaxial layer 156 and an inclined upper surface of the first upper epitaxial layer 157. For example, the upper surface 155ut of the first lower semiconductor film may be defined by the first capping epitaxial layer 158.

In FIG. 14, the carbon concentration of the first lower semiconductor film 155 may include a portion that increases as the distance from the first fin-type pattern 110 increases and a portion that decreases as the distance from the first fin-type pattern 110 increases. More specifically, the carbon concentration of the first lower semiconductor film 155 may increase and decrease as the distance from the interface between the first fin-type pattern 110 and the first semiconductor pattern 150 increases.

For example, along a direction from the interface between the first fin-type pattern 110 and the first semiconductor pattern 150 to the inside of the first semiconductor pattern 150, the first lower semiconductor film 155 may have a portion where carbon concentration increases and a portion where carbon concentration decreases.

For example, the carbon concentration of the first lower semiconductor film 155 at the interface between the first fin-type pattern 110 and the first semiconductor pattern 150 is less than the carbon concentration at the center portion of the first lower semiconductor film 155. Further, the carbon concentration of the first lower semiconductor film 155 at the interface between the first upper semiconductor film 151 and the first lower semiconductor film 155 is less than the carbon concentration at the center portion of the first lower semiconductor film 155.

The carbon concentration of the first upper epitaxial layer 157 is greater than the carbon concentration of the first lower epitaxial layer 156 and the carbon concentration of the first upper epitaxial layer 157 is greater than the carbon concentration of the first capping epitaxial layer 158. The average carbon concentration in the first upper epitaxial layer 157 is greater than the average carbon concentration in the first lower epitaxial layer 156 and the average carbon concentration in the first upper epitaxial layer 157 is greater than the average carbon concentration in the first capping epitaxial layer 158.

The maximum value P1 of the carbon concentration in the first upper epitaxial layer 157 is greater than the maximum value P2 of the carbon concentration in the first lower epitaxial layer 156 and the maximum value P3 of the carbon concentration in the first capping epitaxial layer 158.

As illustrated in FIG. 14, the maximum value P2 of the carbon concentration in the first lower epitaxial layer 156 and the maximum value P3 of the carbon concentration in the first capping epitaxial layer 158 are shown to be the same for the convenience of explanation, but example embodiments are not limited thereto.

During the formation of the first lower epitaxial layer 156 and the first capping epitaxial layer 158, a precursor capable of supplying carbon may not be provided. During forming of the first upper epitaxial layer 157, a precursor for supplying carbon may be provided.

The first upper epitaxial layer 157 which is formed with providing a carbon-containing precursor may be located between the first lower epitaxial layer 156 and the first capping epitaxial layer 158 which are formed without providing a carbon-containing precursor. The first lower semiconductor film 155 may be formed to have, for example, a sandwich structure.

The carbon contained in the first lower epitaxial layer 156 and the first capping epitaxial layer 158 may be carbon diffused from the first upper epitaxial layer 157.

The germanium fraction of the first lower epitaxial layer 156 is less than the germanium fraction of the first upper epitaxial layer 157, the germanium fraction of the first upper epitaxial layer 157 is less than the germanium fraction of the first upper epitaxial layer 157, and the germanium fraction of the first capping epitaxial layer 158 is less than the germanium fraction of the first upper epitaxial layer 157. As illustrated in FIG. 15, the germanium fraction of each of the first lower epitaxial layer 156, the first upper epitaxial layer 157, and the first capping epitaxial layer 158 is same with each other.

Figure 15A:
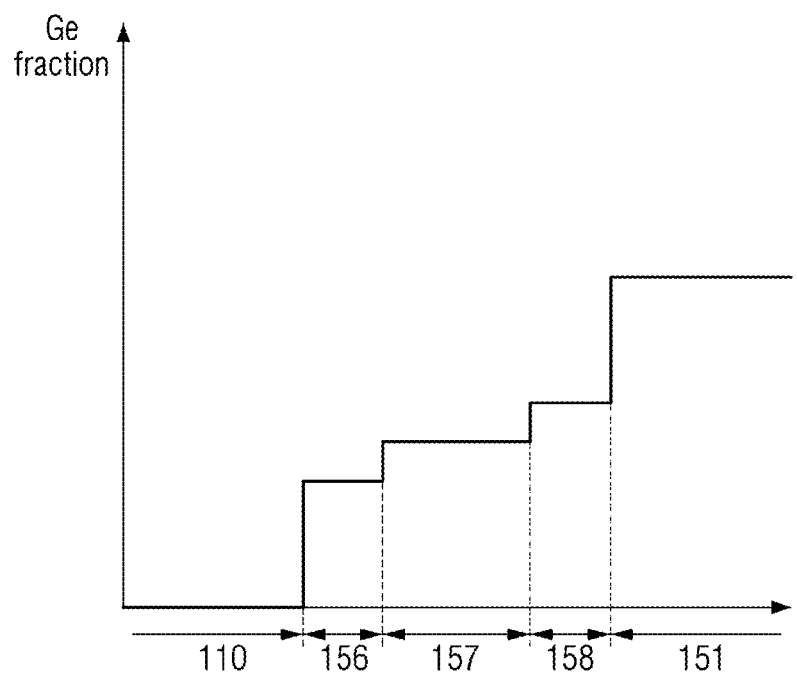

In FIG. 15, the germanium fraction of the first lower semiconductor film 155 is shown to be constant as the distance from the first fin-type pattern 110 increases, but example embodiments are not limited thereto. For example, the germanium fraction of each of the first lower epitaxial layer 156, the first upper epitaxial layer 157, and the first capping epitaxial layer 158 is different from each other. For example, as illustrated in FIG. 15A, the germanium fraction of the first lower epitaxial layer 156 may be less than the germanium fraction of the first upper epitaxial layer 157. Further, the germanium fraction of the first upper epitaxial layer 157 may be less than the germanium fraction of the first capping epitaxial layer 158.

Figure 16:
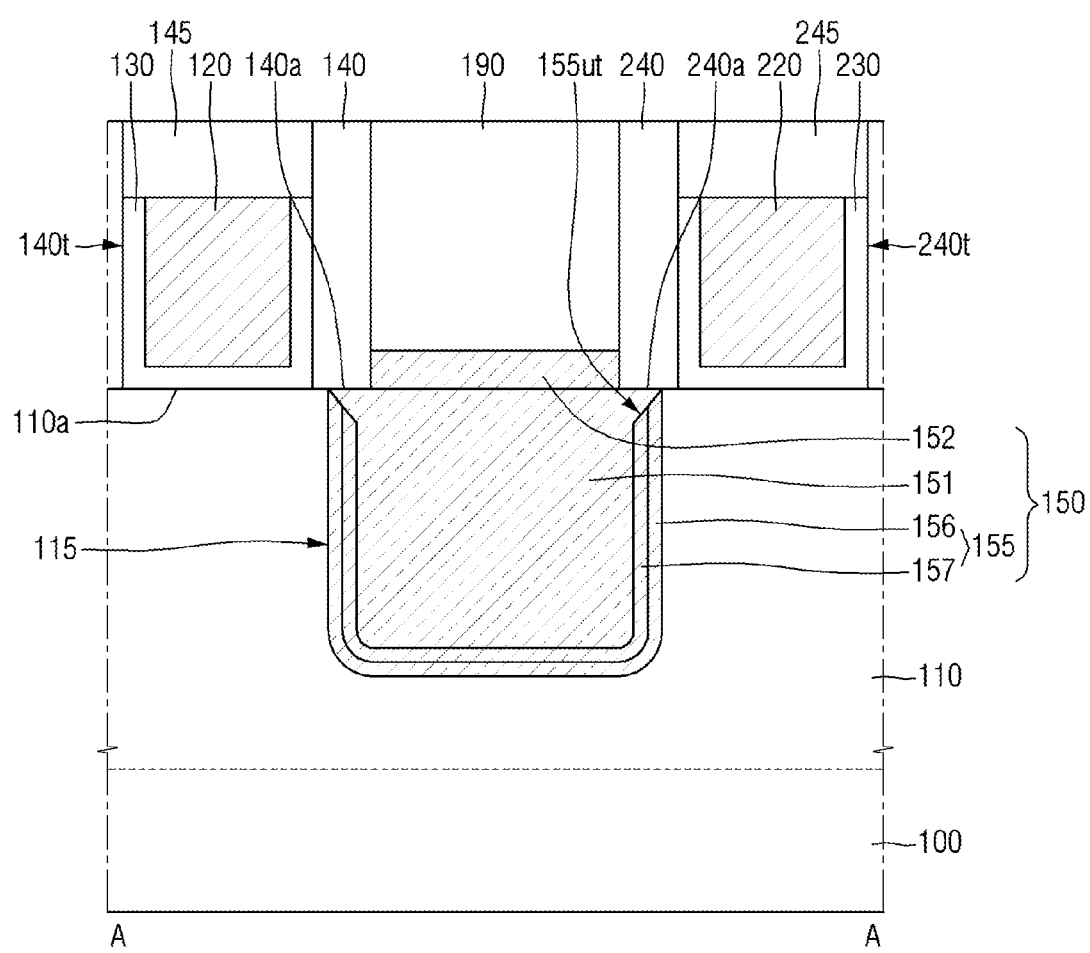
FIG. 16 is a cross-sectional view provided to explain a semiconductor device according to some example embodiments of the present disclosure of the present disclosure.
Figure 17:
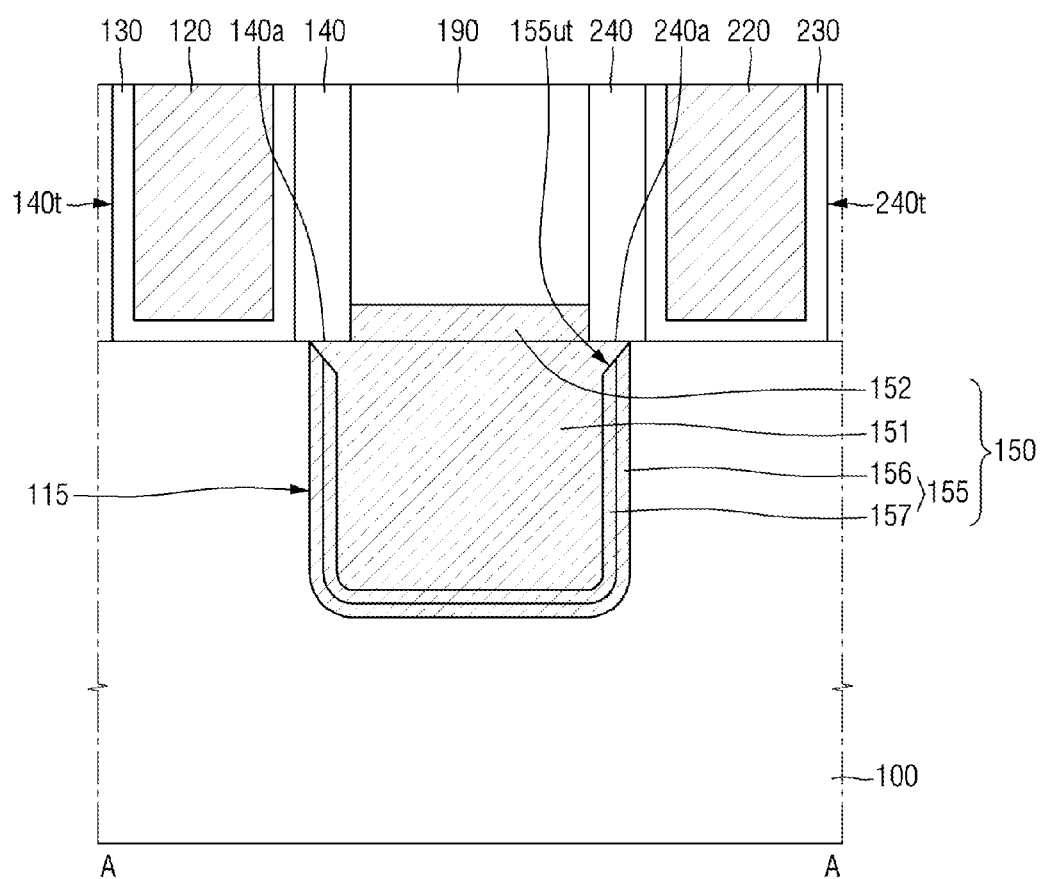
FIG. 17 is a cross-sectional view provided to explain a semiconductor device according to some example embodiments of the present disclosure of the present disclosure.

FIG. 16 is a cross-sectional view provided to explain a semiconductor device according to some example embodiments of the present disclosure. FIG. 17 is a cross-sectional view provided to explain a semiconductor device according to some example embodiments of the present disclosure. For convenience of explanation, differences that are not explained above with reference to FIGS. 1 to 5 will be mainly explained below.

Referring to FIG. 16, the semiconductor device according to some example embodiments may further include a first capping pattern 145 and a second capping pattern 245.

The first gate electrode 120 may fill a portion of the first trench 140t. The first capping pattern 145 may be formed on the first gate electrode 120. The first capping pattern 145 may fill the rest of the first trench 140t remaining after the first gate electrode 120 is formed.

The second gate electrode 220 may fill a portion of the second trench 240t. The second capping pattern 245 may be formed on the second gate electrode 220. The second capping pattern 245 may fill the rest of the second trench 240t remaining after the second gate electrode 220 is formed.

While FIG. 16 illustrates that the first gate insulating film 130 is not formed between the first gate spacer 140 and the first capping pattern 145, and the second gate insulating film 230 is not formed between the second gate spacer 240 and the second capping pattern 245, this is provided only for convenience of explanation and the example embodiments are not limited thereto.

The upper surface of the first capping pattern 145 and the upper surface of the second capping pattern 245 may be respectively placed on the same plane as the upper surface of the interlayer insulating film 190. For example, the uppermost surface of the first capping pattern 145 and the uppermost surface of the second capping pattern 245 may be respectively placed on the same plane as the uppermost surface of the interlayer insulating film 190.

The first capping pattern 145 and the second capping pattern 245 may include, for example, a material having an etch selectivity to the interlayer insulating film 190.

The first capping pattern 145 and the second capping pattern 245 may include at least one of silicon nitride (SiN), silicon oxynitride (SiON), silicon oxide (SiO2), silicon carbon nitride (SiCN), silicon oxycarbon nitride (SiOCN), and a combination thereof.

Referring to FIG. 17, in a semiconductor device according to some example embodiments, the first recess 115 may be formed in the substrate 100.

The first gate electrode 120 and the second gate electrode 220 do not cross over the fin-type pattern protruding from the substrate 100. The first semiconductor pattern 150 may be formed within the substrate 100. The first semiconductor pattern 150 may include an upper surface protruding from the upper surface of the substrate 100.

For example, the semiconductor device shown in FIG. 17 may be a planar transistor, rather than a multi-channel transistor using a fin-type pattern.

Figure 18:
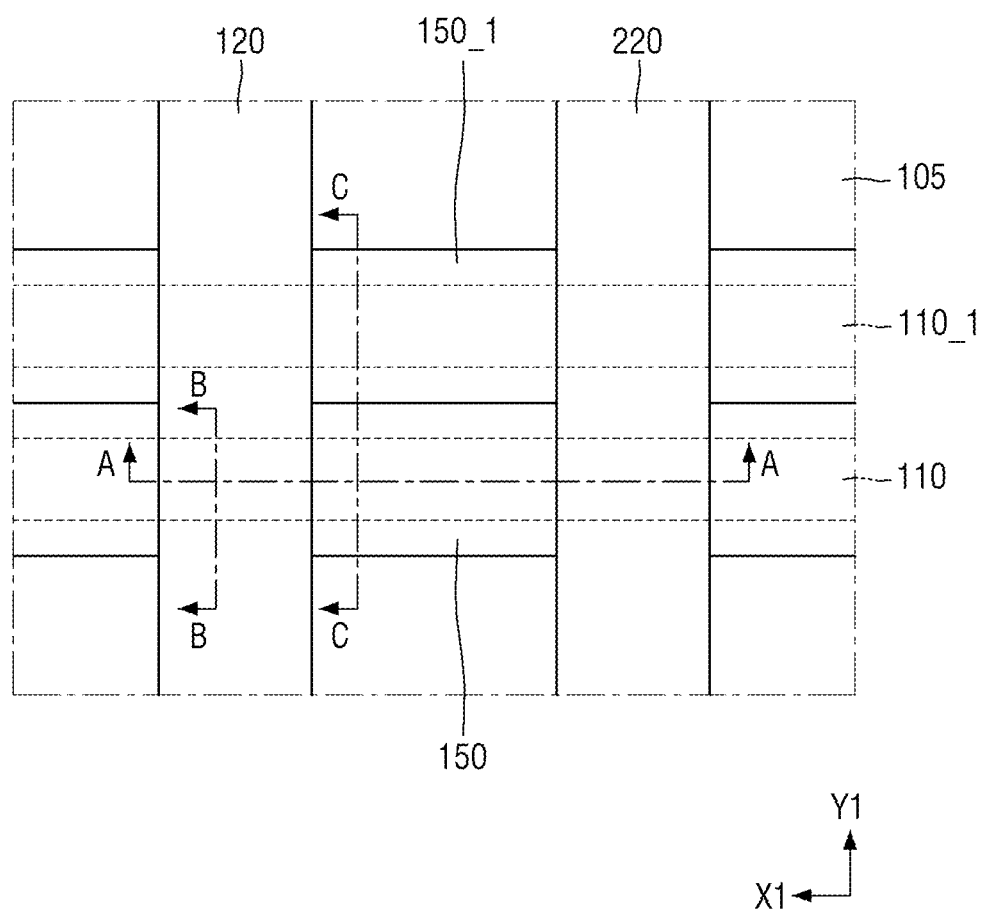
FIG. 18 is a top plan view provided to explain a semiconductor device according to some example embodiments of the present disclosure.
Figure 19:
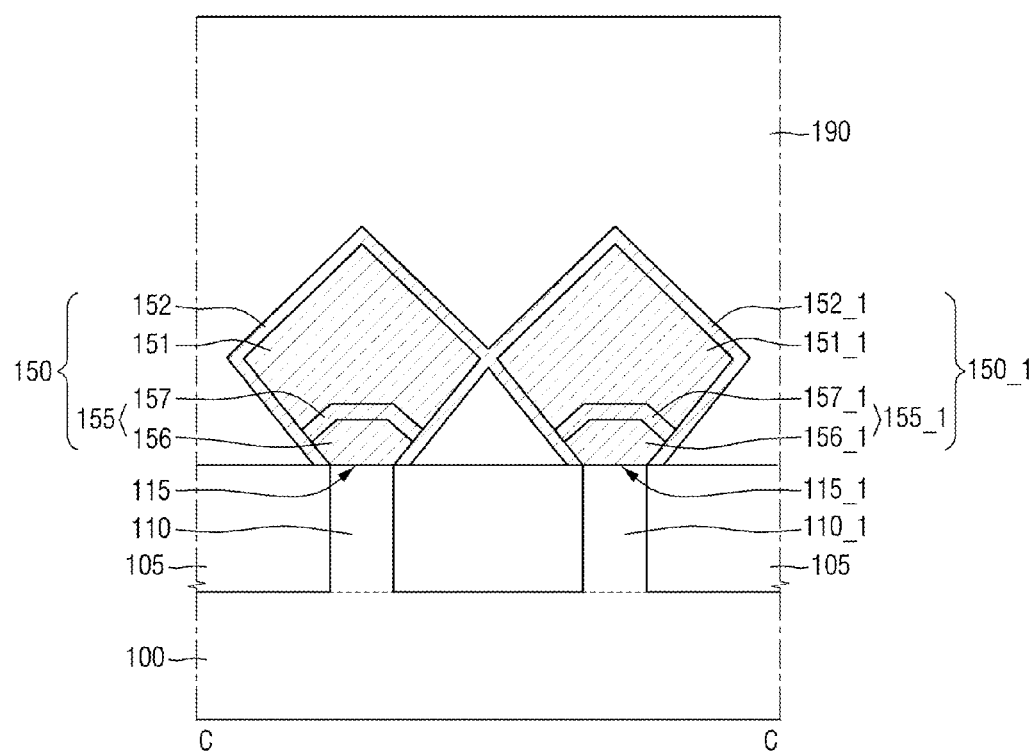
FIG. 19 is a cross-sectional view taken on line C-C of FIG. 18.

FIG. 18 is a top plan view provided to explain a semiconductor device according to some example embodiments of the present disclosure. FIG. 19 is a cross-sectional view taken on line C-C of FIG. 18. For convenience of explanation, differences that are not explained above with reference to FIGS. 1 to 5 will be mainly explained below.

Referring to FIGS. 18 and 19, the semiconductor device according to some example embodiments may further include a 1_1 fin-type pattern 110_1, a 1_1 recess 115_1, and a 1_1 semiconductor pattern 150_1.

The 1_1 fin-type pattern 110_1 may protrude vertically from the substrate 100. At least a portion of the 1_1 fin-type pattern 110_1 protrudes further than the field insulating film 105. The 1_1 fin-type pattern 110_1 is defined by the field insulating film 105 and elongates along the first direction X1.

The 1_1 fin-type pattern 110_1 may extend in parallel with the first fin-type pattern 110 in the longitudinal direction. More specifically, the long side of the 1_1 fin-type pattern 110_1 and the long side of the first fin-type pattern 110 may face each other. The first fin-type pattern 110 and the 1_1 fin-type pattern 110_1 may be arranged in the second direction Y1.

The first gate electrode 120 and the second gate electrode 220 may be formed on the 1_1 fin-type pattern 110_1 so as to cross over the 1_1 fin-type pattern 110_1.

The 1_1 recess 115_1 may be formed between the first gate electrode 120 and the second gate electrode 220. The 1_1 recess 115_1 is formed in the 1_1 fin-type pattern 110_1.

The 1_1 semiconductor pattern 150_1 may fill the 1_1 recess 115_1 and may be formed on the 1_1 fin-type pattern 110_1. The 1_1 semiconductor pattern 150_1 may include a 1_1 lower semiconductor film 155_1, a 1_1 upper semiconductor film 151_1, and a 1_1 capping semiconductor film 152_1 sequentially formed on the 1_1 fin-type pattern 110_1.

The 1_1 lower semiconductor film 155_1 may include carbon as the first lower semiconductor film 155.

The 1_1 lower semiconductor film 155_1 may include a 1_1 lower epitaxial layer 156_1 and a 1_1 upper epitaxial layer 157_1 sequentially formed on the 1_1 fin-type pattern 110_1.

In the semiconductor device according to some example embodiments, the first semiconductor pattern 150 and the 1_1 semiconductor pattern 150_1 may contact with each other. For example, the first semiconductor pattern 150 and the 1_1 semiconductor pattern 150_1 may be connected to each other.

In FIG. 19, the first semiconductor pattern 150 and the 1_1 semiconductor pattern 150_1 are shown as being connected to each other with the first capping semiconductor film 152 and the 1_1 capping semiconductor film 152_1 connected to each other, but example embodiments are not limited thereto.

The material and carbon concentration of the 1_1 semiconductor pattern 150_1 will not be described below, as it may substantially be similar to the description of the first semiconductor pattern 150 described above.

Figure 20:
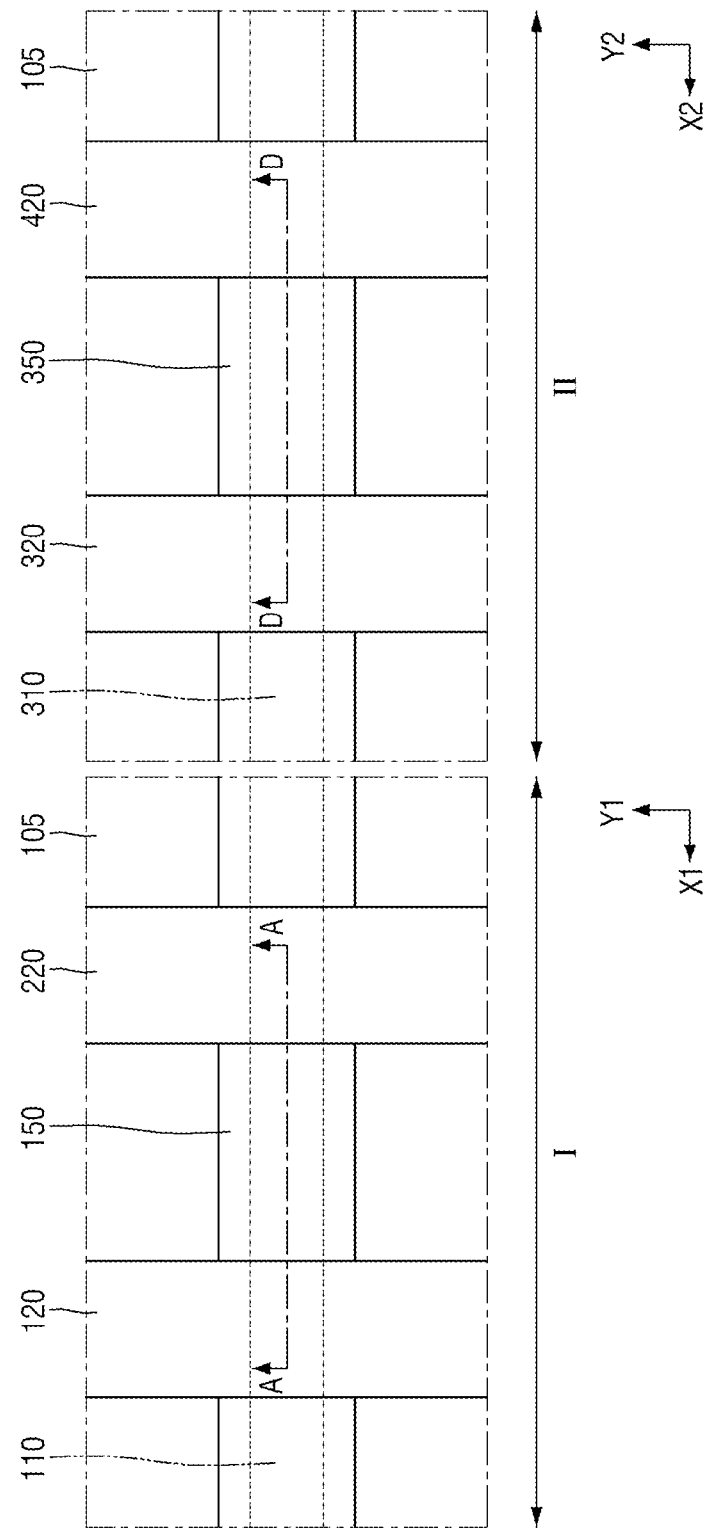
FIG. 20 is a top plan view provided to explain a semiconductor device according to some example embodiments of the present disclosure.
Figure 21:
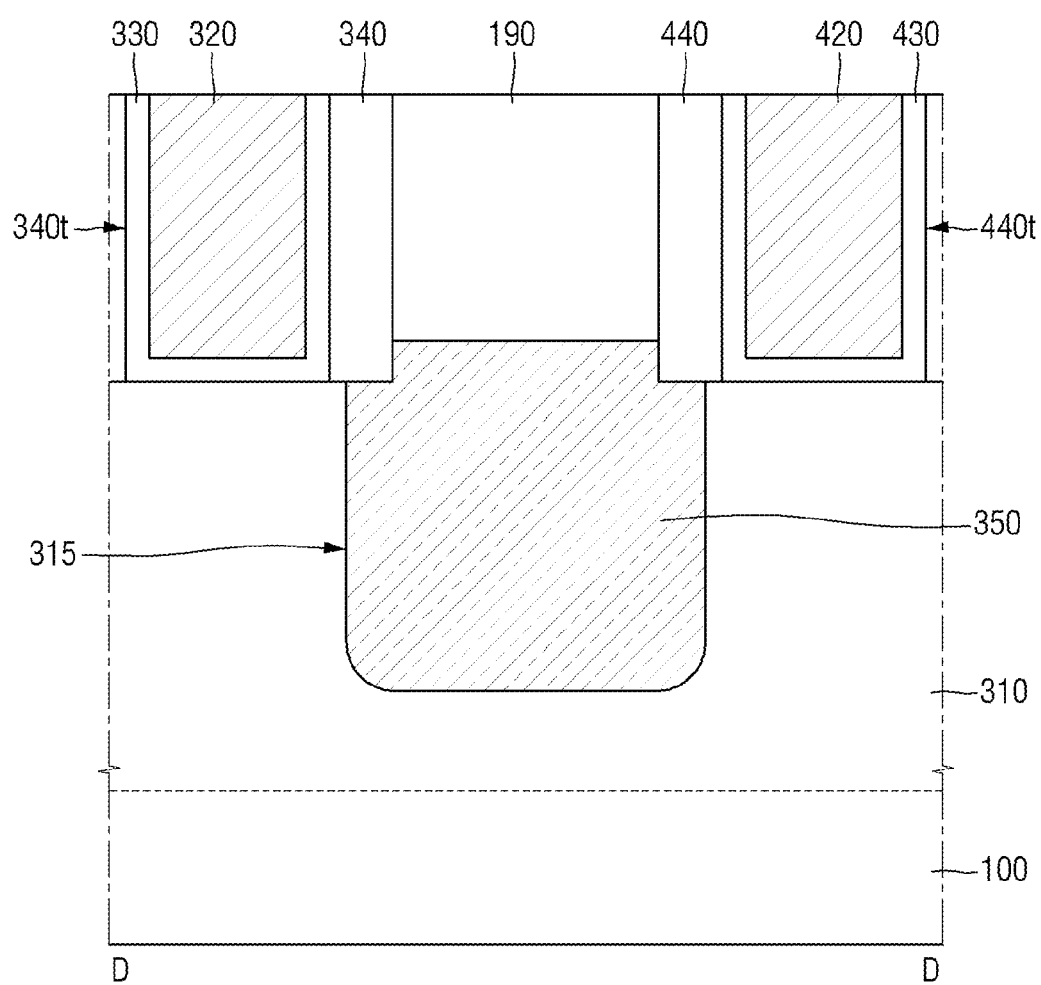
FIG. 21 is a cross-sectional view taken on line D-D of FIG. 20.

FIG. 20 is a top plan view provided to explain a semiconductor device according to some example embodiments of the present disclosure. FIG. 21 is a cross-sectional view taken on line D-D of FIG. 20. For convenience of explanation, differences that are not explained above with reference to FIGS. 1 to 5 will be mainly explained below.

For reference, because the description of the first region A in FIG. 20 is substantially the same as that described with reference to FIGS. 1 to 5, following description of FIG. 20 will be made mainly based on a second region II.

Further, a cross-sectional view taken along line A-A in FIG. 20 may substantially be the same as any of FIGS. 2, 6 to 8, 10, 12, 13, and 16.

Referring to FIGS. 20 and 21, a semiconductor device according to some example embodiments may include a first fin-type pattern 110, a second fin-type pattern 310, a first gate electrode 120, a second gate electrode 220, a third gate electrode 320, a fourth gate electrode 420, a first gate spacer 140, a second gate spacer 240, a third gate spacer 340, a fourth gate spacer 440, a first recess 115, a second recess 315, a first semiconductor pattern 150, and a second semiconductor pattern 350.

The substrate 100 may include a first region I and a second region II. The first region I and the second region II may be the regions that are spaced apart from each other, or connected to each other.

The first region I and the second region II may be regions in which different conductivity types of transistors are formed. For example, the first region I may be a PMOS forming region, and the second region II may be an NMOS forming region.

In the first region I, the first fin-type pattern 110, the first gate electrode 120, the second gate electrode 220, the first gate spacer 140, the second gate spacer 240, the first recess 115, and the first semiconductor pattern 150 may be formed.

In the second region II, the second fin-type pattern 310, the third gate electrode 320, the fourth gate electrode 420, the third gate spacer 340, the fourth gate spacer 440, the second recess 315, and the second semiconductor pattern 350 may be formed.

The second fin-type pattern 310 may protrude vertically from the substrate 100. The second fin-type pattern 310 may be defined by the field insulating film 105. The second fin-type pattern 310 may elongate in a third direction X2. Like the first fin-type pattern 110, the second fin-type pattern 310 may include a variety of semiconductor materials. However, in the semiconductor device according to some example embodiments, the second fin-type pattern 310 is a silicon fin-type active pattern that includes silicon.

The third gate electrode 320 and the fourth gate electrode 420 may be formed, extending in a fourth direction Y2 and crossing over the second fin-type pattern 310. The third gate electrode 320 and the fourth gate electrode 420 may be formed on the second fin-type pattern 310 and the field insulating film 105. The fourth gate electrode 420 may be formed in parallel with the third gate electrode 320. The third gate electrode 320 and the fourth gate electrode 420 may be arranged in a third direction X2.

A third gate spacer 340 may be formed on a sidewall of the third gate electrode 320. The third gate spacer 340 may define the third trench 340t. A fourth gate spacer 440 may be formed on a sidewall of the fourth gate electrode 420. The fourth gate spacer 440 may define a fourth trench 440t.

A third gate insulating film 330 may be formed between the second fin-type pattern 310 and the third gate electrode 320. The third gate insulating film 330 may be formed along a sidewall and a bottom surface of the third trench 340t. A fourth gate insulating film 430 may be formed between the second fin-type pattern 310 and the fourth gate electrode 420. The fourth gate insulating film 430 may be formed along the sidewall and the bottom surface of the fourth trench 440t.

A second recess 315 may be formed between the third gate electrode 320 and the fourth gate electrode 420. The second recess 315 may be formed between the third gate spacer 340 and the fourth gate spacer 440 which are facing each other. The second recess 315 is formed within the second fin-type pattern 310.

The second semiconductor pattern 350 may be formed within the second recess 315. The second semiconductor pattern 350 may be formed on the second fin-type pattern 310 between the third gate electrode 320 and the fourth gate electrode 420. The second semiconductor pattern 350 may be a semiconductor epitaxial pattern grown by using epitaxial process.

The second semiconductor pattern 350 may be included within the source/drain of a transistor which uses the second fin-type pattern 310 as channel region. The second semiconductor pattern 350 may be included in a source/drain of an NMOS transistor. The second semiconductor pattern 350 may include a doped n-type dopant. For example, the second semiconductor pattern 350 may include at least one of P, Sb, and As.

In some example embodiments, the second semiconductor pattern 350 may include silicon.

In the semiconductor device according to some example embodiments, the second semiconductor pattern 350 may not include a carbon-containing epitaxial layer in vicinity of the interface of the second fin-type pattern 310 and the second semiconductor pattern 350.

Figure 22:
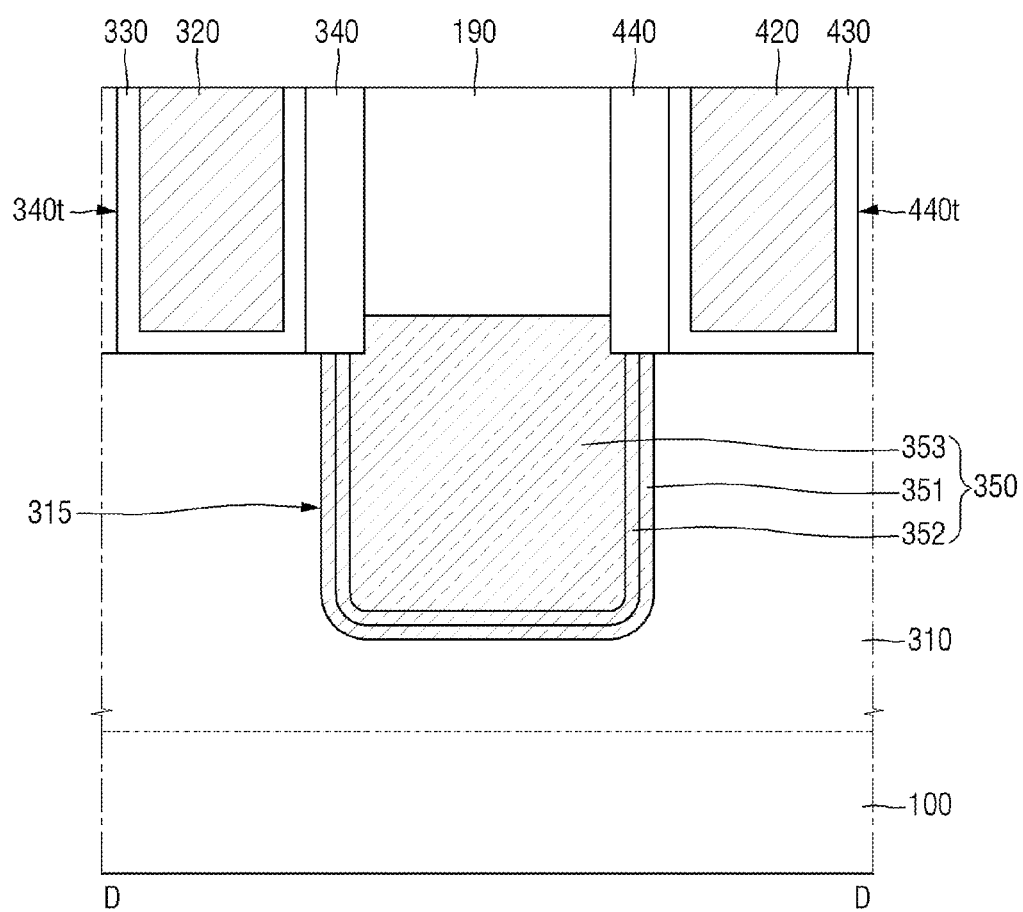
FIG. 22 is a cross-sectional view provided to explain a semiconductor device according to some example embodiments of the present disclosure.

FIG. 22 is a cross-sectional view provided to explain a semiconductor device according to some example embodiments of the present disclosure. For convenience of explanation, differences that are not explained above with reference to FIGS. 20 and 21 will be mainly explained below.

Referring to FIG. 22, in a semiconductor device according to some example embodiments, the second semiconductor pattern 350 may include a second lower epitaxial layer 351, a second insertion epitaxial layer 352, and a second upper epitaxial layer 353.

The second lower epitaxial layer 351 may be formed along a profile of the second recess 315. The second insertion epitaxial layer 352 may be formed on the second lower epitaxial layer 351. The second insertion epitaxial layer 352 may be formed along a profile of the second recess 315. The second insertion upper epitaxial layer 353 may be formed on the second insertion epitaxial layer 352. The second upper epitaxial layer 353 may fill the second recess 315 in which the second lower epitaxial layer 351 and the second insertion epitaxial layer 352 are formed.

During the formation of the second lower epitaxial layer 351 and the second upper epitaxial layer 353, a precursor capable of supplying carbon may not be provided. During forming of the second insertion epitaxial layer 352, a precursor for supplying carbon may be provided. For example, the second insertion epitaxial layer 352 may be a carbon-containing epitaxial layer.

However, the carbon contained in the second insertion epitaxial layer 352 may be diffused into the second lower epitaxial layer 351 and the second upper epitaxial layer 353 in a subsequent semiconductor fabricating process.

In the semiconductor device according to some example embodiments, the carbon concentration of a first portion of the second semiconductor pattern 350 may increase as the distance from the interface between the second fin-type pattern 310 and the second semiconductor pattern 350 increases in a direction and the carbon concentration of a second portion of the second semiconductor pattern 350 may decrease as the distance from the interface between the second fin-type pattern 310 and the second semiconductor pattern 350 increases in the direction.

Figure 23:
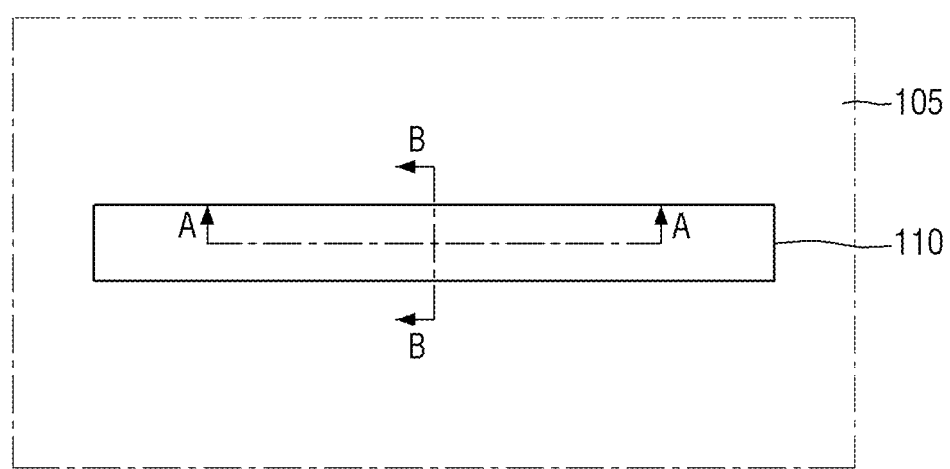
FIGS. 23 to 32 are cross-sectional views illustrating intermediate stages of fabrication, provided to explain a method for fabricating a semiconductor device according to some example embodiments of the present disclosure.

FIGS. 23 to 32 are cross-sectional views illustrating intermediate stages of fabrication, provided to explain a method for fabricating a semiconductor device according to some example embodiments of the present disclosure. For reference, FIG. 24A is a cross-sectional view taken on line A-A of FIG. 23, and FIG. 24B is a cross-sectional view taken on line B-B of FIG. 23. Further, the fabricating method described with reference to FIGS. 25 to 32 is a fabricating method proceeding from FIG. 24A.

Figure 24A:
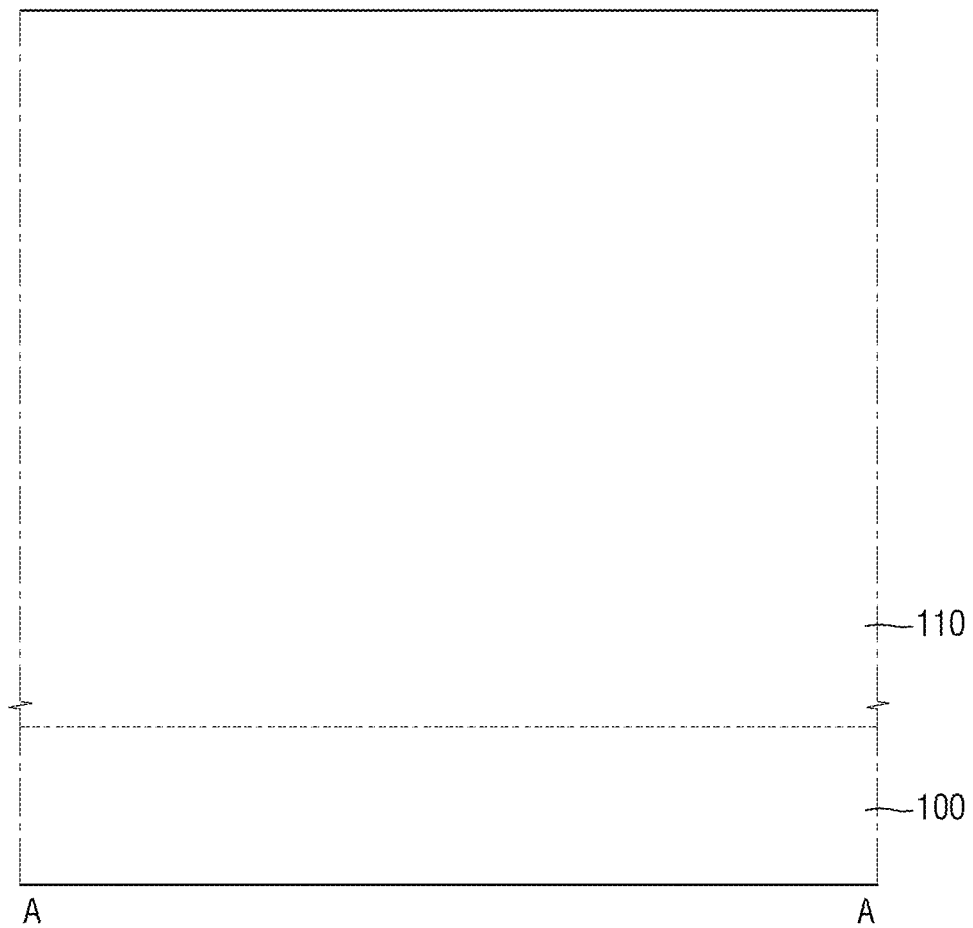
Figure 24B:
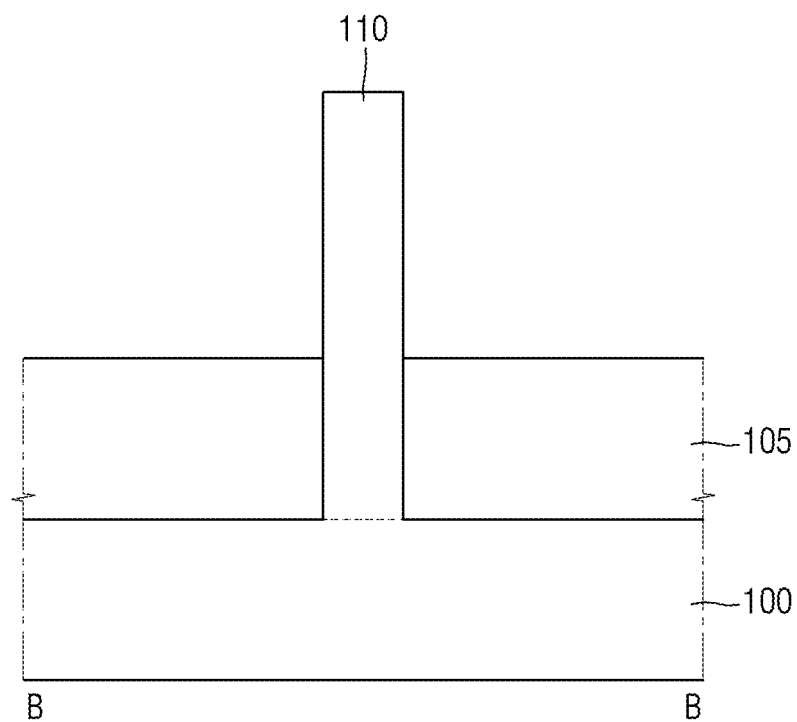

Referring to FIGS. 23 to 24B, the first fin-type pattern 110 projecting from the substrate 100 is formed on the substrate 100. The first fin-type pattern 110 may elongate in a first direction X1. A field insulating film 105 may be formed, partially overlying side surface of the first fin-type pattern 110.

Figure 25:
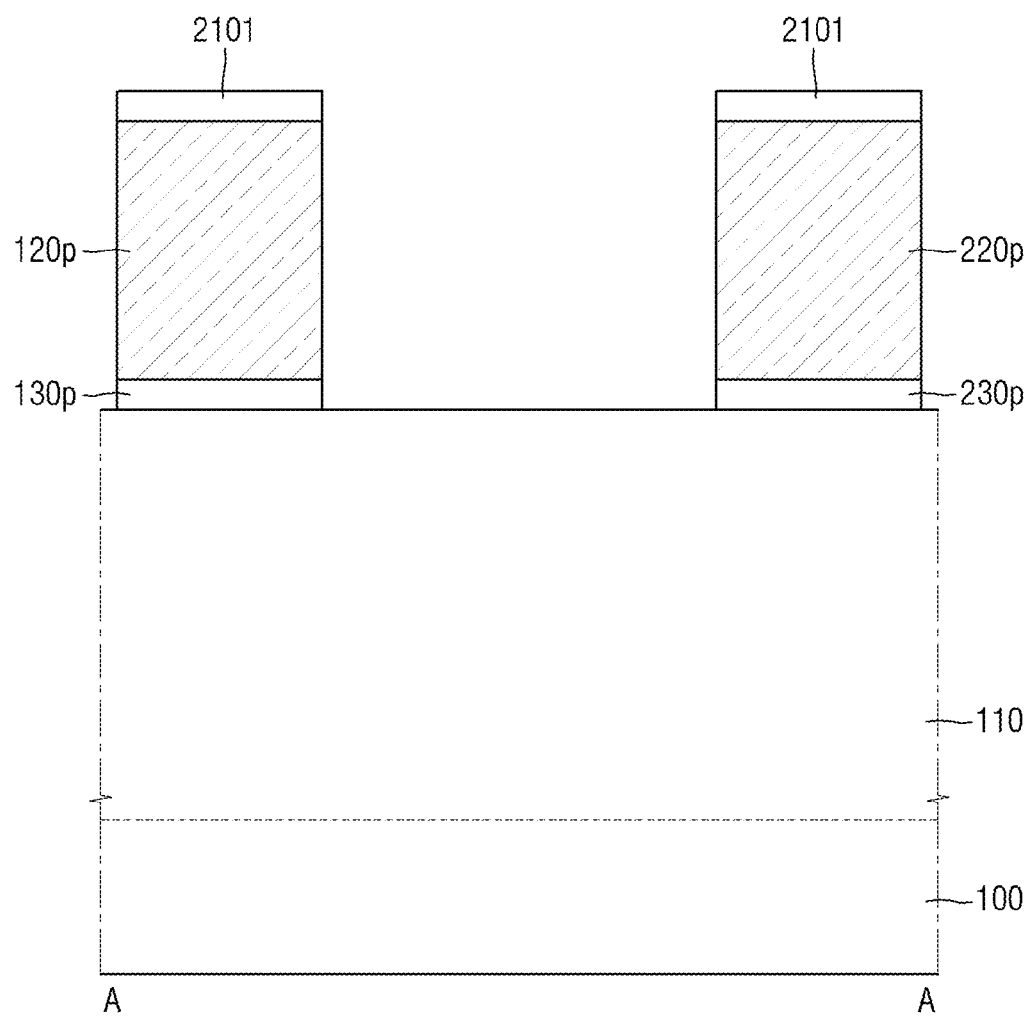

Referring to FIG. 25, a first dummy gate electrode 120*p* and a second dummy gate electrode 220*p* crossing over the first fin-type pattern 110 may be formed on the first fin-type pattern 110.

The first dummy gate electrode 120*p* and the second dummy gate electrode 220*p* may be formed by etch process using a mask pattern 2101. In some example embodiments, the first dummy gate electrode 120*p* and the second dummy gate electrode 220*p* may include polysilicon or amorphous silicon. A first dummy gate insulating film 130*p* may be formed between the first dummy gate electrode 120*p* and the first fin-type pattern 110, and a second dummy gate insulating film 230*p* may be formed between the second dummy gate electrode 220*p* and the first fin-type pattern 110. In some example embodiments, the first dummy gate insulating film 130*p* and the second dummy gate insulating film 230*p* may include silicon oxide.

Figure 26:
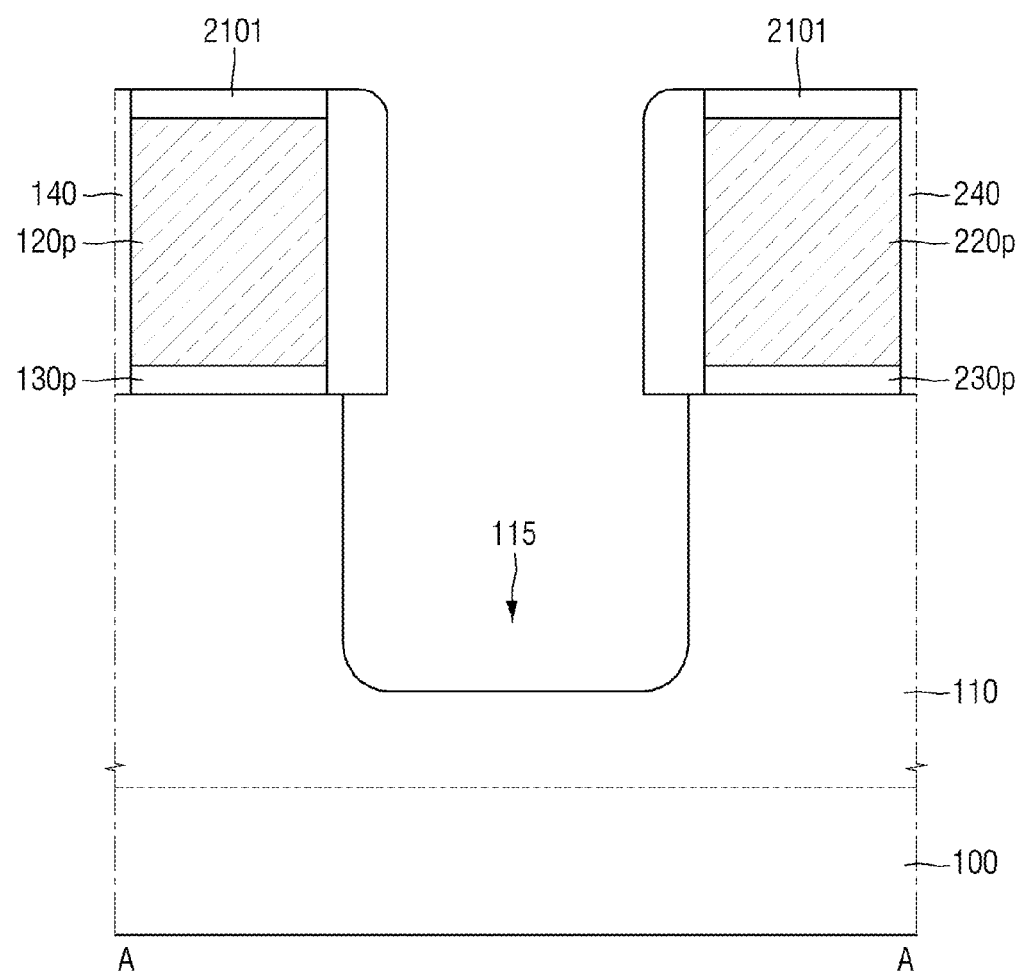

Referring to FIG. 26, the first gate spacer 140 is formed on a sidewall of the first dummy gate electrode 120*p*, and the second gate spacer 240 is formed on a sidewall of the second dummy gate electrode 220*p*.

While the first gate spacer 140 and the second gate spacer 240 are being formed, the first recess 115 may be formed in the first fin-type pattern 110. The first recess 115 may be formed between the first dummy gate electrode 120*p* and the second dummy gate electrode 220*p*.

In an alternative embodiment, the first recess 115 may be formed after the first gate spacer 140 and the second gate spacer 240 are formed.

Figure 27:
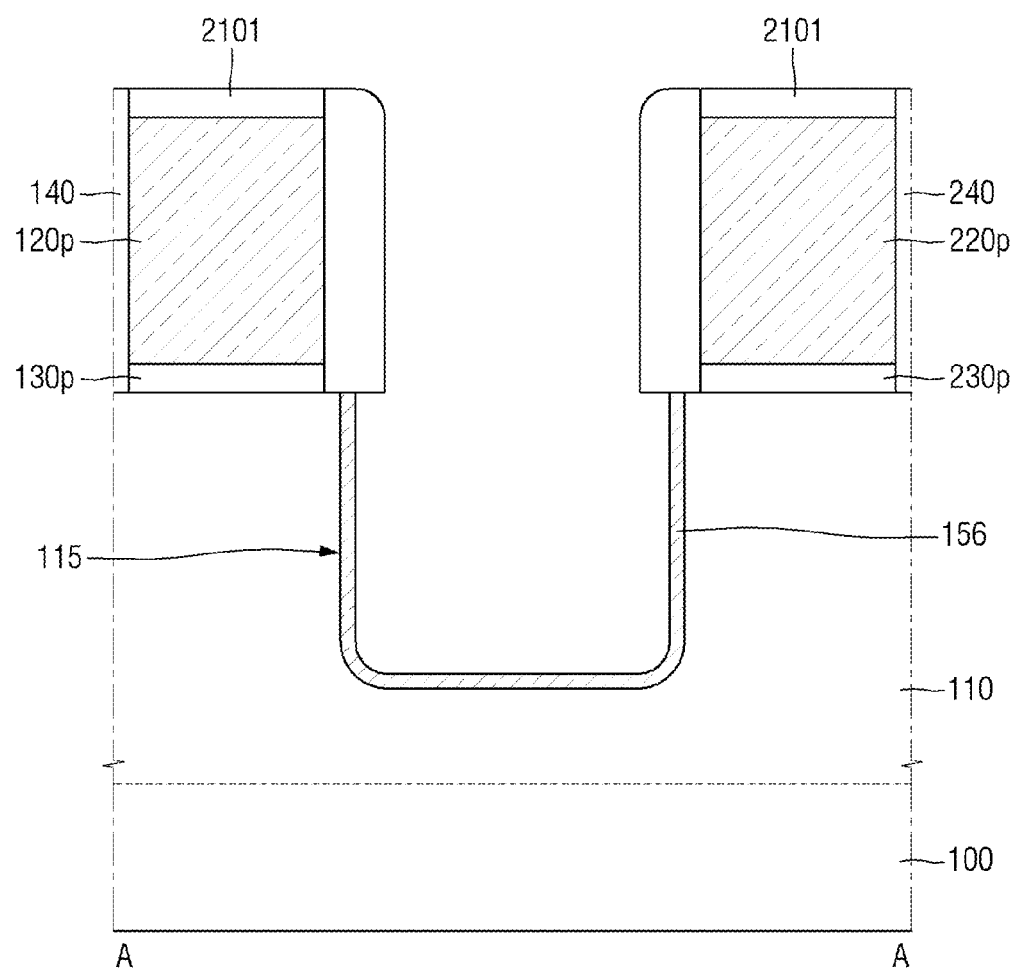

Referring to FIG. 27, a first lower epitaxial layer 156 may be formed along the profile of the first recess 115. A first lower epitaxial layer 156 is formed on the first fin-type pattern 110. The first lower epitaxial layer 156 may be grown by using the epitaxial method, for example.

When the semiconductor device is a PMOS, the first lower epitaxial layer 156 may include silicon germanium, for example. The first lower epitaxial layer 156 may be silicon germanium film. During formation of the first lower epitaxial layer 156, the p-type dopant to be doped in the first lower epitaxial layer 156 may or may not be provided.

When the semiconductor device is an NMOS, the first lower epitaxial layer 156 may include silicon, for example.

The first lower epitaxial layer 156 may be silicon film. During formation of the first lower epitaxial layer 156, the n-type dopant to be doped in the first lower epitaxial layer 156 may or may not be provided.

While the first lower epitaxial layer 156 is being grown, no precursor capable of supplying carbon is provided. For example, the precursors provided for growing the first lower epitaxial layer 156 do not include precursors capable of supplying carbon. For example, the first lower epitaxial layer 156 may be an epitaxial layer not containing carbon.

Figure 28:
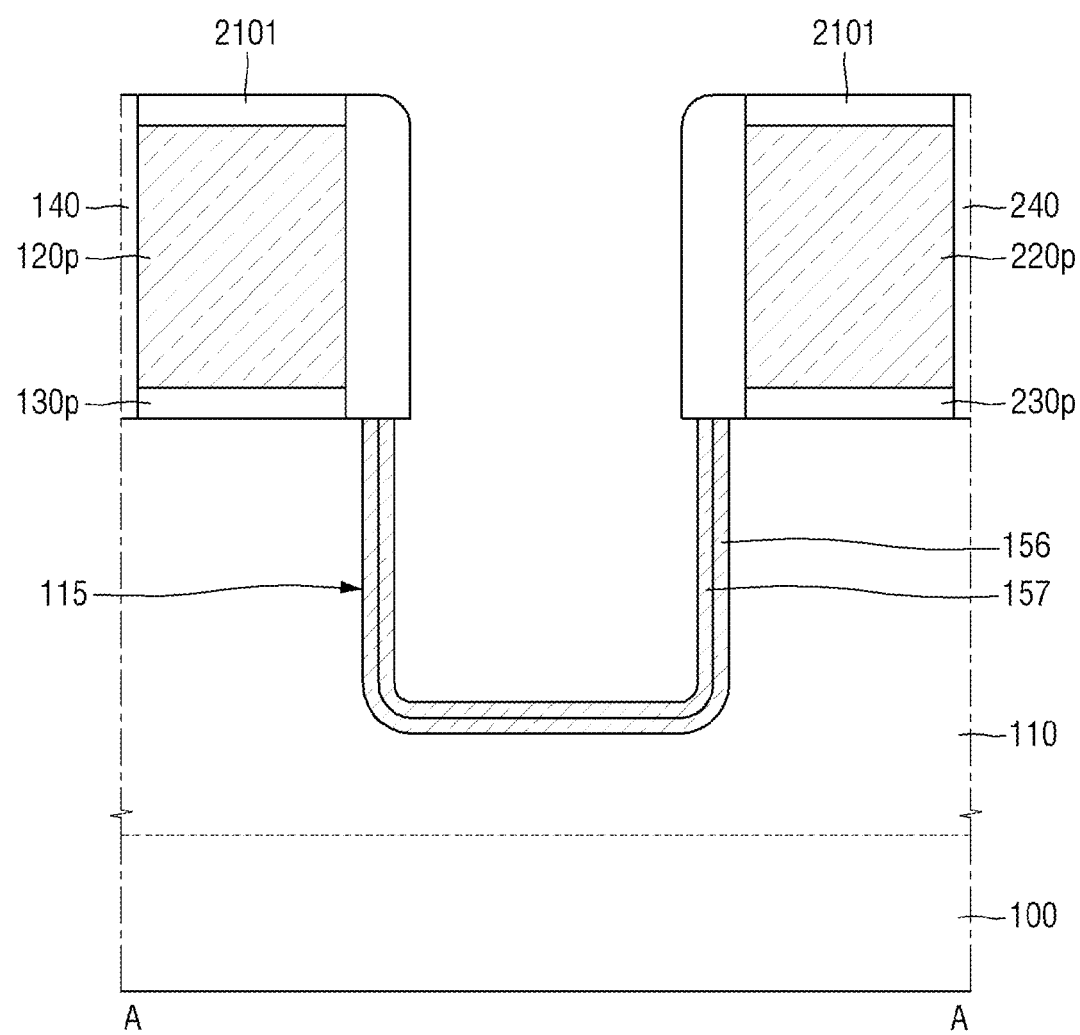

Referring to FIG. 28, a first upper epitaxial layer 157 is formed on the first lower epitaxial layer 156 along the profile of the first lower epitaxial layer 156. The first upper epitaxial layer 157 may be grown by using the epitaxial method, for example.

When the semiconductor device is a PMOS, the first upper epitaxial layer 157 may include silicon germanium, for example. The first upper epitaxial layer 157 may be silicon germanium film. When the semiconductor device is an NMOS, the first upper epitaxial layer 157 may include silicon, for example. The first upper epitaxial layer 157 may be silicon film. During formation of the first upper epitaxial layer 157, the p-type or n-type dopant to be doped in the first upper epitaxial layer 157 may or may not be provided.

While the first upper epitaxial layer 157 is being grown, a precursor capable of supplying carbon is provided. For example, among the precursors provided for growing the first upper epitaxial layer 157, a precursor capable of supplying carbon is included. For example, the first upper epitaxial layer 157 may be a carbon-containing epitaxial layer or a carbon-doped epitaxial layer.

Figure 29:
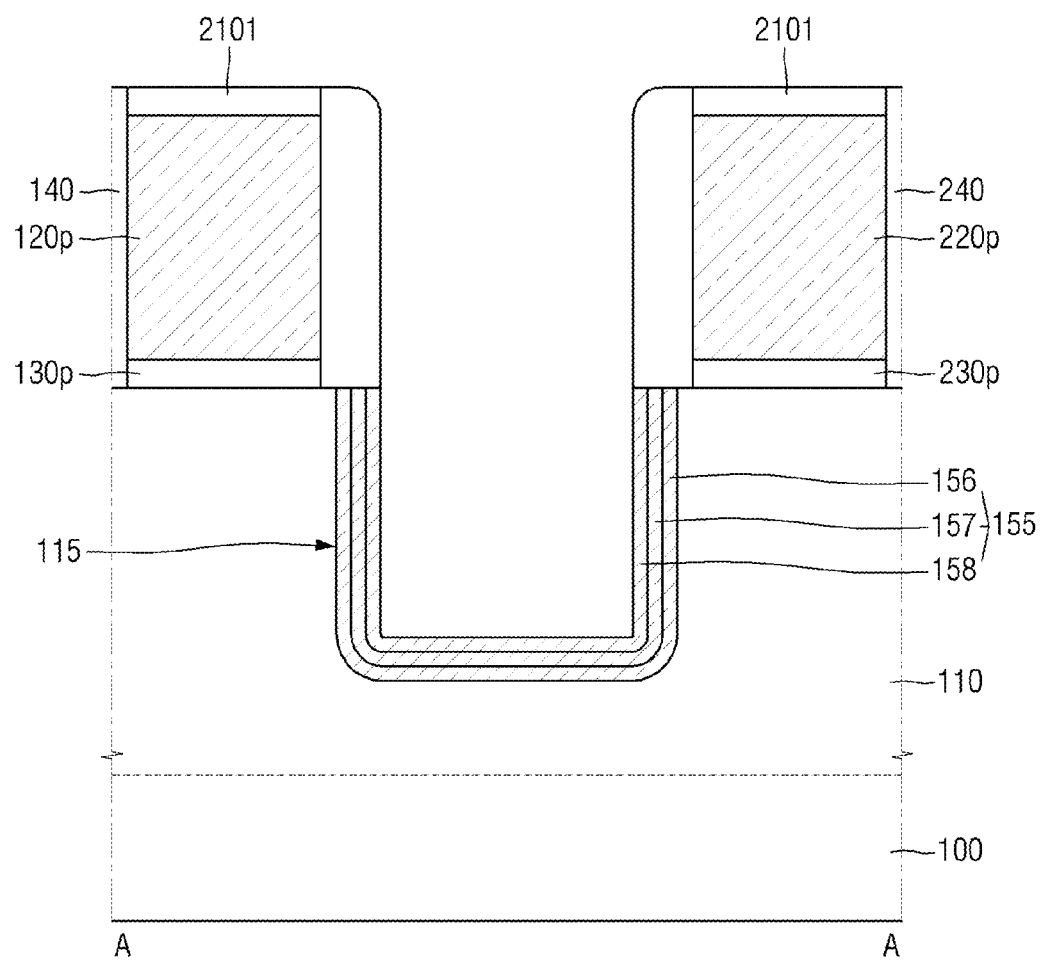

Referring to FIG. 29, a first capping epitaxial layer 158 may be formed on the first upper epitaxial layer 157 along the profile of the first upper epitaxial layer 157. The first capping epitaxial layer 158 may be grown by using the epitaxial method, for example.

When the semiconductor device is a PMOS, the first capping epitaxial layer 158 may include silicon germanium, for example. The first capping epitaxial layer 158 may be silicon germanium film. During formation of the first capping epitaxial layer 158, the p-type dopant to be doped in the first capping epitaxial layer 158 may or may not be provided.

While the first capping epitaxial layer 158 is being grown, no precursor capable of supplying carbon is provided. For example, among the precursors provided for growing the first capping epitaxial layer 158, precursors capable of supplying carbon are not included. For example, the first capping epitaxial layer 158 may be an epitaxial layer not containing carbon.

As a result, along the profile of the first recess 115, the first lower semiconductor film 155 may be formed on the first fin-type pattern 110.

In some embodiments, forming the first capping epitaxial layer 158 may be optional. For example, the first lower semiconductor film 155 may not include the first capping epitaxial layer 158. In addition, the carbon contained in the first upper epitaxial layer 157 may be diffused into the first lower epitaxial layer 156 and the first capping epitaxial layer 158.

In addition, during formation of the first lower semiconductor film 155, at least some of the epitaxial layers of the first lower semiconductor film 155 may not be doped with a p-type dopant or an n-type dopant. However, the epitaxial layer not doped with the p-type dopant or the n-type dopant may also include a dopant diffused from the first upper semiconductor film 151 (see FIG. 30) or the like.

In FIG. 29, the first lower semiconductor film 155 does not include an upper surface having an obtuse angle with respect to the upper surface of the first fin-type pattern 110, but example embodiments are not limited thereto.

Figure 30:
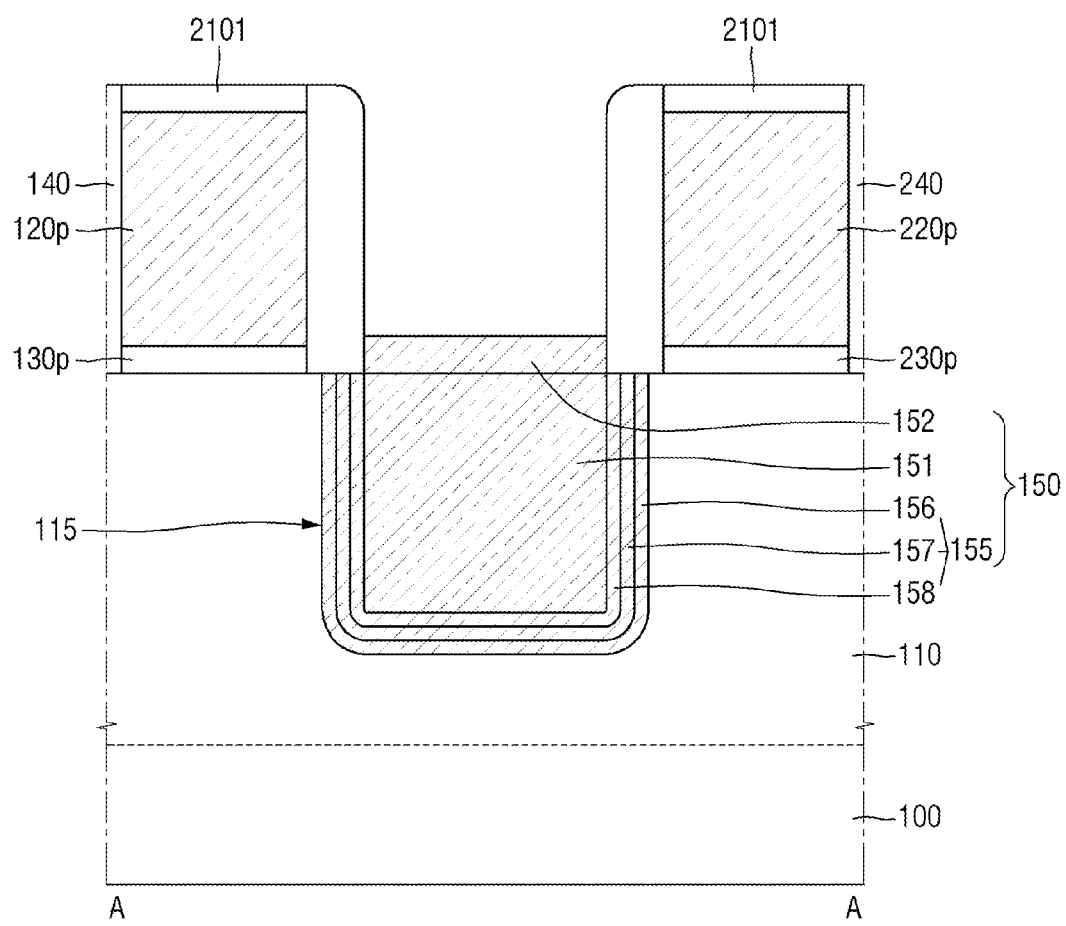

Referring to FIG. 30, a first upper semiconductor film 151 and a first capping semiconductor film 152 are sequentially formed on a first lower semiconductor film 155 through an epitaxial growth method.

When the semiconductor device is a PMOS, the first upper semiconductor film 151 may include silicon germanium having a greater germanium fraction than the first lower semiconductor film 155, for example. The first upper semiconductor film 151 may be silicon germanium film. Further, the first capping semiconductor film 152 may include silicon. A p-type dopant to be doped in the first upper semiconductor film 151 and the first capping semiconductor film 152 is provided while the first upper semiconductor film 151 and the first capping semiconductor film 152 are being formed.

Figure 31:
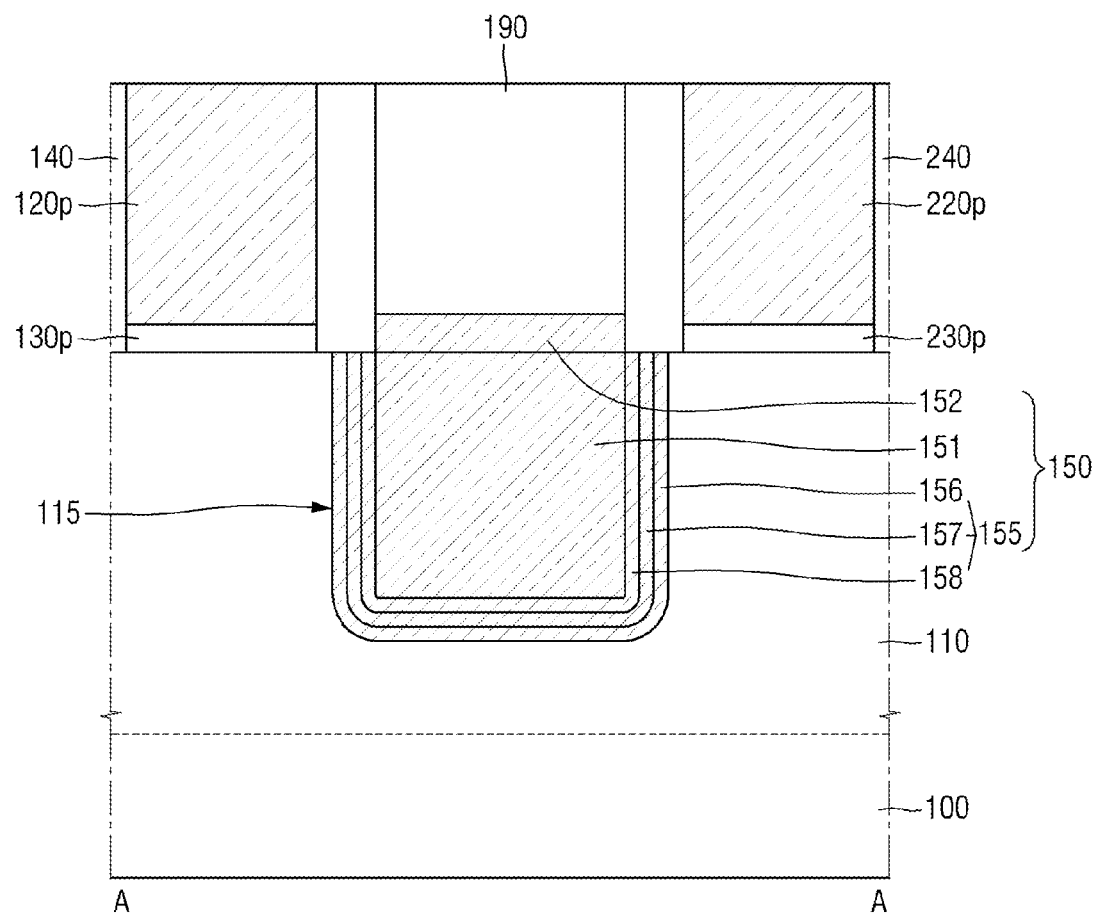

Referring to FIG. 31, an interlayer insulating film 190 may be formed such that it covers the first semiconductor pattern 150, and the first and second dummy gate electrodes 120p and 220p.

Then, the interlayer insulating film 190 may be planarized until the upper surfaces of the first and second dummy gate electrodes 120p and 220p are exposed. As a result, the mask pattern 2101 may be removed, and the upper surfaces of the first and second dummy gate electrodes 120p and 220p may be exposed.

Figure 32:
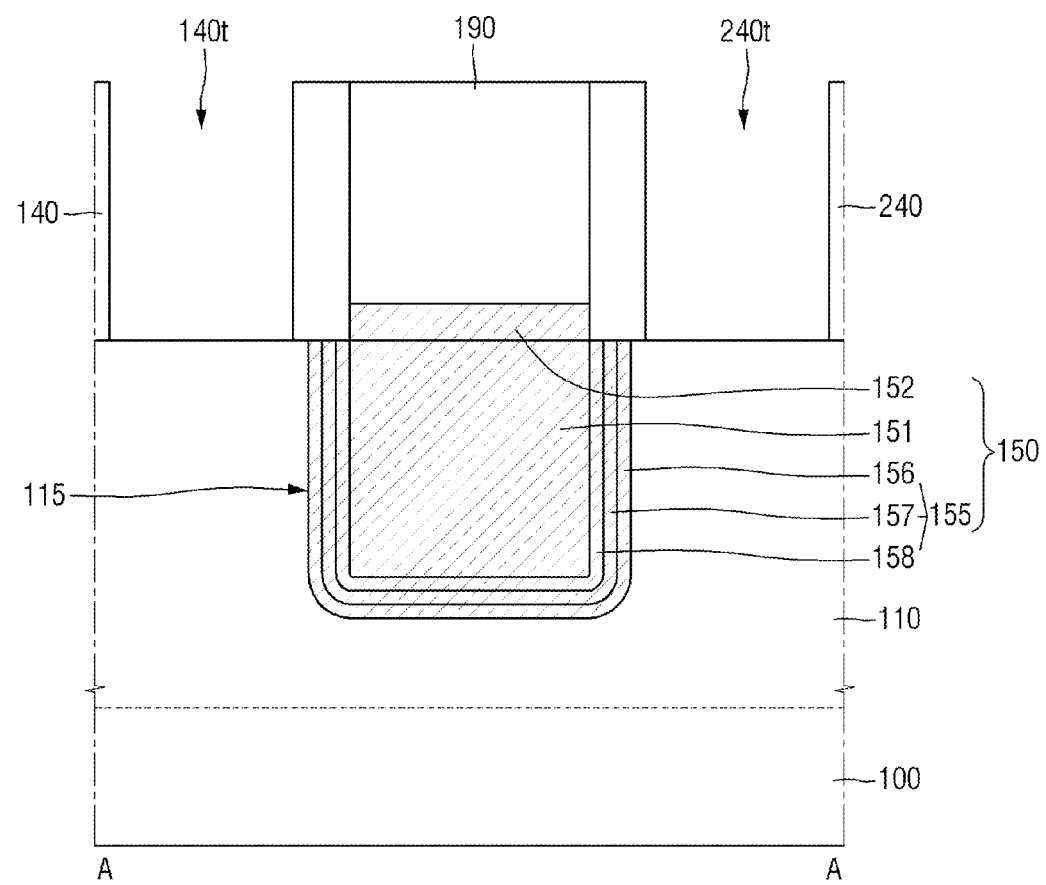

Referring to FIG. 32, the first and second dummy gate electrodes 120p and 220p are removed, and the first and second dummy gate insulating films 130p and 230p are removed. The first and second dummy gate electrodes 120p and 220p and the first and second dummy gate insulating films 130p and 230p are removed so that a portion of the first fin-type pattern 110 may be exposed.

Next, as illustrated in FIG. 2, a first gate insulating film 130 and the first gate electrode 120, and the second gate insulating film 230 and the second gate electrode 220 may be formed in a space from which the first and second dummy gate electrodes 120p and 220p and the first and second dummy gate insulating films 130p and 230p are removed.

In concluding the detailed description, those skilled in the art will appreciate that many variations and modifications can be made to the preferred embodiments without substantially departing from the principles of the present disclosure. Therefore, the disclosed preferred embodiments of the inventive concept are used in a generic and descriptive sense only and not for purposes of limitation.

What is clamed is:

1. A semiconductor device comprising:
   a first gate electrode and a second gate electrode spaced apart from each other on a fin-type pattern;
   a recess formed in the fin-type pattern between the first gate electrode and the second gate electrode; and
   a semiconductor pattern including a lower semiconductor film formed along a profile of the recess and an upper semiconductor film on the lower semiconductor film,
   wherein the lower semiconductor film includes a lower epitaxial layer and an upper epitaxial layer sequentially formed on the fin-type pattern, and
   a carbon concentration of the upper epitaxial layer is greater than a carbon concentration of the lower epitaxial layer.

2. The semiconductor device of claim 1,
   wherein the lower semiconductor film further includes a capping epitaxial layer on the upper epitaxial layer, and
   a carbon concentration of the capping epitaxial layer is lower than the carbon concentration of the upper epitaxial layer.

3. The semiconductor device of claim 1,
   wherein the lower semiconductor film includes an upper surface having an obtuse angle with respect to an upper surface of the fin-type pattern, and
   the upper semiconductor film covers the upper surface of the lower semiconductor film.

4. The semiconductor device of claim 1,
   wherein a ratio of a maximum value of the carbon concentration of the upper epitaxial layer to a maximum value of the carbon concentration of the lower epitaxial layer is between 10 and 100 inclusive.

5. The semiconductor device of claim 1, wherein the upper semiconductor film is in contact with the upper epitaxial layer, and
   a carbon concentration of the upper semiconductor film is less than the carbon concentration of the upper epitaxial layer.

6. The semiconductor device of claim 1, wherein the lower semiconductor film and the upper semiconductor film including silicon germanium, respectively, and
   a germanium fraction of the lower semiconductor film is less than a germanium fraction of the upper semiconductor film.

7. The semiconductor device of claim 6, wherein the semiconductor pattern further includes an insertion semiconductor film including silicon germanium between the lower semiconductor film and the upper semiconductor film, and
   a germanium fraction of the upper semiconductor film is greater than a germanium fraction of the insertion semiconductor film.

8. The semiconductor device of claim 1,
   wherein the lower semiconductor film is conformally formed along the profile of the recess.

9. A semiconductor device, comprising:
   a fin-type pattern;
   a first gate electrode and a second gate electrode spaced apart from each other on the fin-type pattern, and crossing over the fin-type pattern;
   a recess formed in the fin-type pattern between the first gate electrode and the second gate electrode; and
   a semiconductor pattern formed along a profile of the recess and including a lower semiconductor film containing carbon and an upper semiconductor film on the lower semiconductor film,
   wherein a carbon concentration of the lower semiconductor film increases as a distance from the fin-type pattern increases in a first direction from an interface between the fin-type pattern and the semiconductor pattern to a location inside of the semiconductor pattern.

10. The semiconductor device of claim 9,
    wherein the carbon concentration of the lower semiconductor film increases and then decreases as the distance from the fin-type pattern increases in the first direction.

11. The semiconductor device of claim 9,
    wherein the lower semiconductor film includes a lower epitaxial layer and an upper epitaxial layer on the lower epitaxial layer, and
    a carbon concentration of the upper epitaxial layer is greater than a carbon concentration of the lower epitaxial layer.

12. The semiconductor device of claim 9,
wherein the lower semiconductor film includes a lower epitaxial layer, an upper epitaxial layer on the lower epitaxial layer, and a capping epitaxial layer on the upper epitaxial layer, and
a carbon concentration of the upper epitaxial layer is greater than a carbon concentration of the lower epitaxial layer and the carbon concentration of the upper epitaxial layer is greater than a carbon concentration of the capping epitaxial layer.

13. The semiconductor device of claim 9,
wherein the lower semiconductor film and the upper semiconductor film include silicon germanium, respectively, and
a germanium fraction of the lower semiconductor film is less than a germanium fraction of the upper semiconductor film.

14. The semiconductor device of claim 13,
wherein the germanium fraction of the lower semiconductor film is constant as the distance from the fin-type pattern increases in the first direction.

15. The semiconductor device of claim 13,
wherein the lower semiconductor film includes a lower epitaxial layer formed along the profile of the recess and an upper epitaxial layer on the lower epitaxial layer, and
the germanium fraction of the lower epitaxial layer is less than the germanium fraction of the upper epitaxial layer.

16. The semiconductor device of claim 15, wherein the germanium fraction of the upper epitaxial layer is less than the germanium fraction of the upper semiconductor film.

* * * * *